United States Patent
Wei et al.

(10) Patent No.: US 9,362,450 B2
(45) Date of Patent: Jun. 7, 2016

(54) LIGHT EMITTING DIODE

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/565,433

(22) Filed: Dec. 10, 2014

(65) Prior Publication Data

US 2015/0280063 A1    Oct. 1, 2015

(30) Foreign Application Priority Data

Mar. 26, 2014  (CN) .......................... 2014 1 0115416

(51) Int. Cl.
| | |
|---|---|
| H01L 33/10 | (2010.01) |
| H01L 33/20 | (2010.01) |
| H01L 33/32 | (2010.01) |
| H01L 21/00 | (2006.01) |
| H01L 33/00 | (2010.01) |
| H01L 33/22 | (2010.01) |

(52) U.S. Cl.
CPC ............... H01L 33/20 (2013.01); H01L 33/32 (2013.01); *H01L 33/007* (2013.01); *H01L 33/22* (2013.01)

(58) Field of Classification Search
None
See application file for complete search history.

(56) References Cited

U.S. PATENT DOCUMENTS

| | | | | | |
|---|---|---|---|---|---|
| 6,808,746 | B1 * | 10/2004 | Dai | .......................... | B82Y 30/00 216/109 |
| 8,558,217 | B2 * | 10/2013 | Wei | ..................... | H01L 21/0237 257/103 |
| 8,841,147 | B2 * | 9/2014 | Wei | .......................... | H01L 33/32 438/29 |
| 9,012,946 | B2 * | 4/2015 | Wei | ..................... | H01L 21/0237 257/13 |
| 2008/0142824 | A1 * | 6/2008 | Chen | ................... | H01L 33/0079 257/98 |
| 2010/0313944 | A1 * | 12/2010 | Curran | .................. | B82Y 10/00 136/255 |
| 2012/0175742 | A1 * | 7/2012 | Wei | ........................ | B82Y 30/00 257/618 |
| 2012/0247808 | A1 * | 10/2012 | Lam | ........................ | H01B 1/02 174/126.2 |
| 2012/0273755 | A1 * | 11/2012 | Wei | ........................ | B82Y 20/00 257/13 |
| 2012/0273818 | A1 * | 11/2012 | Wei | ..................... | H01L 21/0237 257/98 |
| 2012/0273827 | A1 * | 11/2012 | Wei | ........................ | B82Y 20/00 257/99 |
| 2012/0276666 | A1 * | 11/2012 | Wei | ................... | H01L 21/02521 438/22 |
| 2012/0276670 | A1 * | 11/2012 | Wei | ..................... | H01L 33/0079 438/42 |
| 2012/0276671 | A1 * | 11/2012 | Wei | ..................... | H01L 21/0237 438/42 |
| 2014/0065742 | A1 * | 3/2014 | Wei | ........................ | H01L 33/32 438/29 |
| 2015/0274527 | A1 * | 10/2015 | Ma | ....................... | C01B 31/0226 264/235 |
| 2015/0274543 | A1 * | 10/2015 | Ma | ........................... | C01F 7/02 428/131 |
| 2015/0279928 | A1 * | 10/2015 | Wei | ........................ | H01L 29/06 257/618 |
| 2015/0280054 | A1 * | 10/2015 | Wei | ....................... | H01L 33/007 438/22 |
| 2015/0280063 | A1 * | 10/2015 | Wei | ........................ | H01L 33/32 257/99 |

* cited by examiner

*Primary Examiner* — Hoang-Quan Ho
(74) *Attorney, Agent, or Firm* — Novak Druce Connolly Bove + Quigg LLP

(57) ABSTRACT

The disclosure relates to a light emitting diode. The light emitting diode includes a first semiconductor layer, an active layer, and a second semiconductor layer, a first electrode, a second electrode and a nanotube film. The first semiconductor layer, the active layer, and the second semiconductor layer are stacked with each other in that order. The first electrode is electrically connected with the second semiconductor layer. The second electrode is electrically connected with the first semiconductor layer. The nanotube film is located on one of the first semiconductor layer, the active layer and the second semiconductor layer. The nanotube film comprises a number of nanotubes orderly arranged and combined with each other by ionic bonds.

13 Claims, 28 Drawing Sheets

# LIGHT EMITTING DIODE

CROSS-REFERENCE TO RELTATED APPLICATIONS

This application claims priority to Chinese Patent Application No. 201410115416.8 filed on Mar. 26, 2014 in the China Intellectual Property Office, the contents of which are incorporated by reference herein.

FIELD

The subject matter herein generally relates to light emitting diode and methods for making the same.

BACKGROUND

Light emitting devices such as light emitting diodes (LEDs) based on group III-V nitride semiconductors such as gallium nitride (GaN) have been put into practice.

Since wide GaN substrate cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads to cracking and difficulty in fabricating devices with small feature sizes. A solution for this is to form a plurality of grooves on the surface of the sapphire substrate by lithography or etching before growing the GaN layer. However, the process of lithography and etching is complex, high in cost, and will pollute the sapphire substrate.

What is needed, therefore, is to provide a method for solving the problem discussed above.

BRIEF DESCRIPTION OF THE DRAWINGS

Implementations of the present technology will now be described, by way of example only, with reference to the attached figures, wherein.

DETAILED DESCRIPTION

Figure 1:
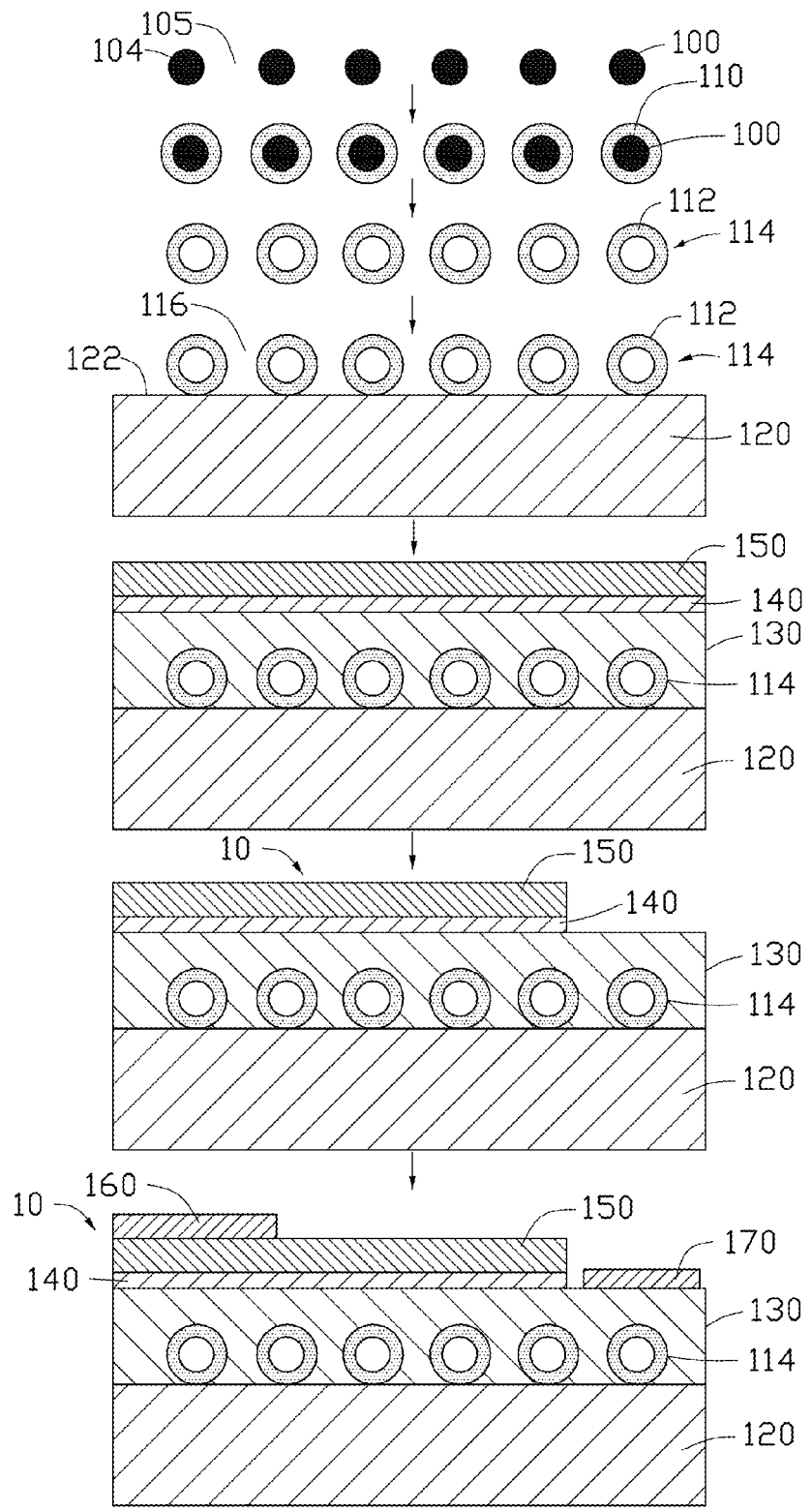
FIG. 1 is a flowchart of one embodiment of a method for making a light emitting diode.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present light emitting diodes and methods for making the same.

Referring to FIG. 1, a method for making a light emitting diode 10 of one embodiment includes the following steps:

step (S10), providing a free standing carbon nanotube film 100, wherein the carbon nanotube film 100 includes a plurality of carbon nanotubes 104 orderly arranged and combined with each other via van der Waals force to form a plurality of apertures 105 extending along a length direction of the plurality of carbon nanotubes 104;

step (S20), inducing defects on surfaces of the plurality of carbon nanotubes 104;

step (S30), growing a nano-material layer 110 on the surfaces of the plurality of carbon nanotubes 104 by atomic layer deposition;

step (S40), obtaining a free-standing nanotube film 114 by removing the carbon nanotube film 100 by annealing, wherein nanotube film 114 includes a plurality of nanotubes 112 orderly arranged and combined with each other;

step (S50), placing the nanotube film 114 on an epitaxial growth surface 122 of a substrate 120;

step (S60), epitaxially growing a first semiconductor layer 130, an active layer 140 and a second semiconductor layer 150 on the epitaxial growth surface 122 of the substrate 120 in that order;

step (S70), exposing a part of the first semiconductor layer 130 by etching the active layer 140 and the second semiconductor layer 150; and step (80), applying a first electrode 160 on the second semiconductor layer 150 and a second electrode 170 on the exposed part of the first semiconductor layer 130.

In step (S10), the carbon nanotube film 100 is drawn from a carbon nanotube array. Referring to FIGS. 2-5, the carbon nanotube film 100 is a substantially pure structure consisting of a plurality of carbon nanotubes 104, 106, with few impurities and chemical functional groups. The carbon nanotube film 100 is a free-standing structure. The term "free-standing structure" includes that the carbon nanotube film 100 can sustain the weight of itself when it is hoisted by a portion thereof without any significant damage to its structural integrity. Thus, the carbon nanotube film 100 can be suspended by two spaced supports. The majority of carbon nanotubes 104 of the carbon nanotube film 100 are joined end-to-end along a length direction of the carbon nanotubes 104 by van der Waals force therebetween so that the carbon nanotube film 10 is a free-standing structure. The carbon nanotubes 104, 106 of the carbon nanotube film 100 can be single-walled, double-walled, or multi-walled carbon nanotubes. The diameter of the single-walled carbon nanotubes can be in a range from about 0.5 nm to about 50 nm. The diameter of the double-walled carbon nanotubes can be in a range from about 1.0 nm to about 50 nm. The diameter of the multi-walled carbon nanotubes can be in a range from about 1.5 nm to about 50 nm.

The carbon nanotubes 104, 106 of the carbon nanotube film 100 are oriented along a preferred orientation. That is, the majority of carbon nanotubes 104 of the carbon nanotube film 100 are arranged to substantially extend along the same direction and in parallel with the surface of the carbon nanotube film 100. Each adjacent two of the majority of carbon nanotubes 104 are joined end-to-end by van der Waals force therebetween along the length direction. A minority of dispersed carbon nanotubes 106 of the carbon nanotube film 100 may be located and arranged randomly. However, the minority of dispersed carbon nanotubes 106 have little effect on the properties of the carbon nanotube film 100 and the arrangement of the majority of carbon nanotubes 104 of the carbon nanotube film 100. The majority of carbon nanotubes 104 are not absolutely form a direct line and extend along the axial direction, some of them may be curved and in contact with each other in microcosm. Some variations can occur in the carbon nanotube film 100.

Figure 3:
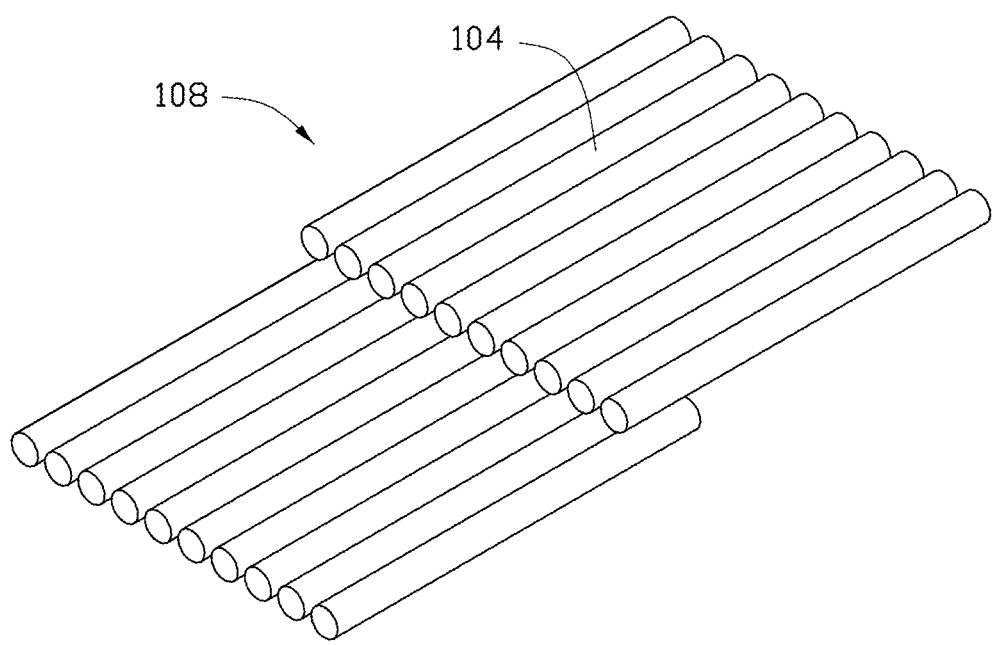
FIG. 3 is a schematic structural view of a carbon nanotube segment of the carbon nanotube film of FIG. 2.

Referring to FIG. 3, the carbon nanotube film 100 includes a plurality of successively oriented carbon nanotube segments 108, joined end-to-end by van der Waals force therebetween. Each carbon nanotube segment 108 includes a plurality of carbon nanotubes 104 parallel to each other, and combined by van der Waals force therebetween. A thickness, length and shape of the carbon nanotube segment 108 are not limited. A thickness of the carbon nanotube film 100 can range from about 0.5 nanometers to about 100 micrometers, such as 10 nanometers, 50 nanometers, 200 nanometers, 500 nanometers, 1 micrometer, 10 micrometers, or 50 micrometers.

Figure 4:
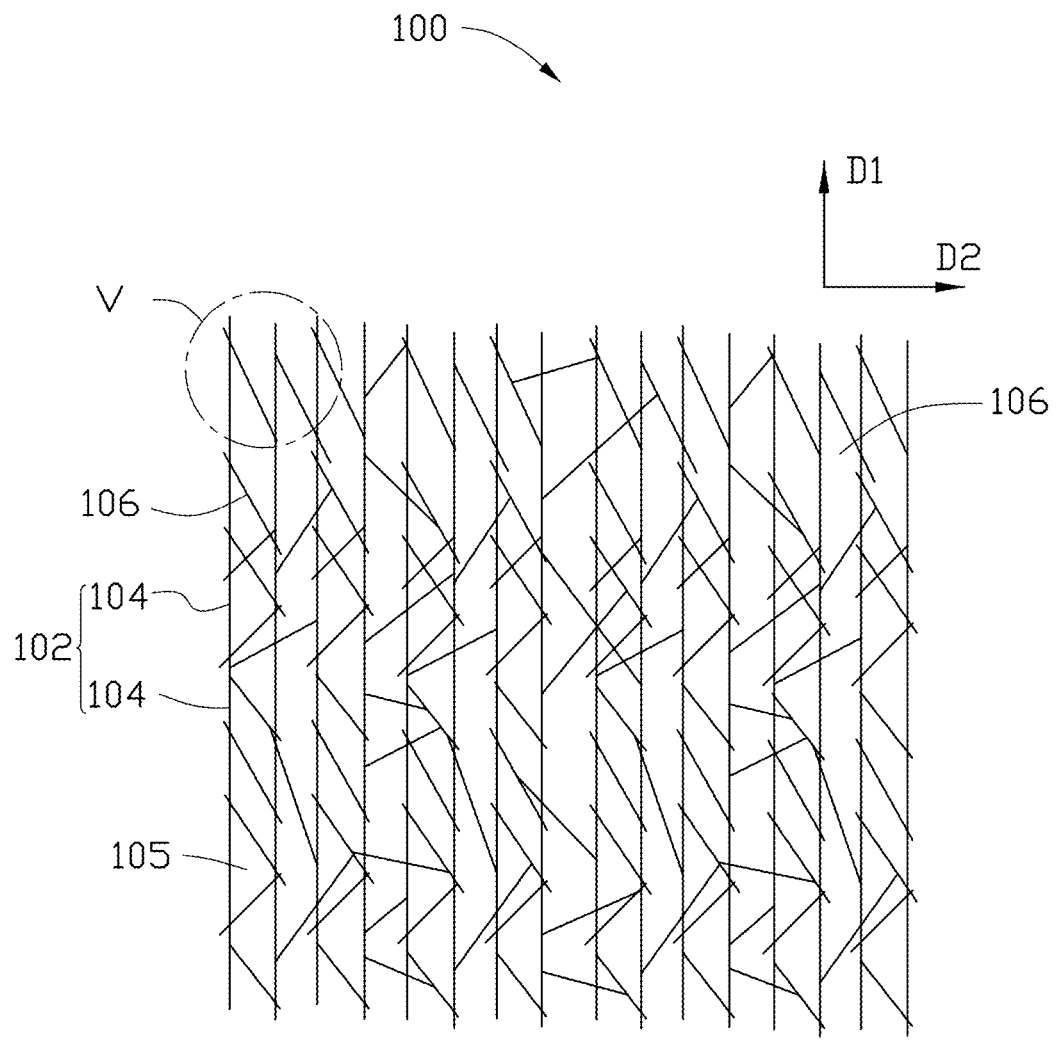
FIG. 4 is a schematic structural view of the carbon nanotube film of FIG. 2.
Figure 5:
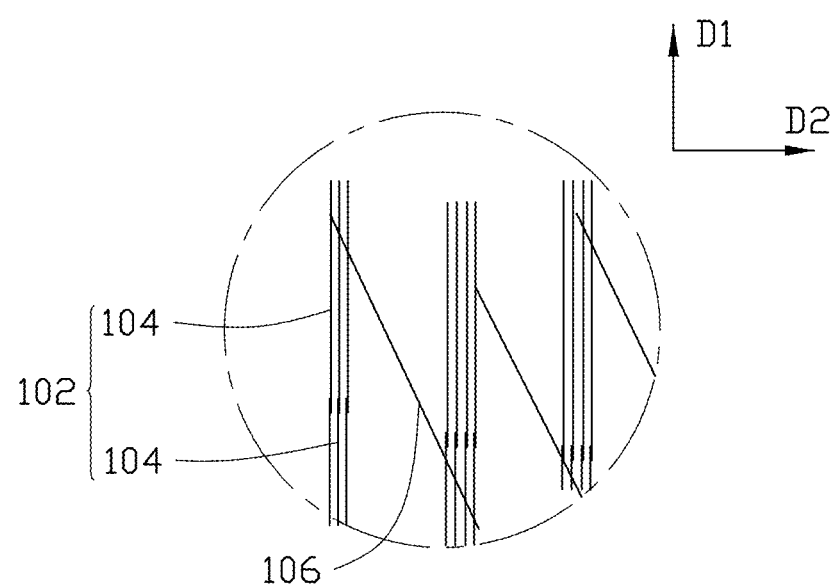
FIG. 5 is a partially enlarged view of FIG. 4.

Referring to FIGS. 4-5, the majority of carbon nanotubes 104 of the carbon nanotube film 100 are arranged to substantially extend along the same direction to form a plurality of carbon nanotube wires 102 substantially parallel with each other. The minority of carbon nanotubes 106 are randomly dispersed on and in direct contact with the plurality of carbon nanotube wires 102. The extending direction of the majority of carbon nanotubes 104 is defined as D1, and a direction perpendicular with D1 and parallel with the carbon nanotube film 100 is defined as D2. The carbon nanotubes 104 of each carbon nanotube wire 102 are joined end-to-end along D1, and substantially parallel and combined with each other along D1. The plurality of apertures 105 are defined between adjacent two of the plurality of carbon nanotube wires 102 or the plurality of carbon nanotubes 104.

The carbon nanotube film 100 is stretchable along D2. When the carbon nanotube film 100 is stretched along D2, the carbon nanotube film 100 can maintain its film structure. A distance between adjacent two of the plurality of carbon nanotube wires 102 will be changed according to the deformation of the carbon nanotube film 100 along D2. The distance between adjacent two of the plurality of carbon nanotube wires 102 can be in a range from about 0 micrometers to about 50 micrometers. The ratio of quantity or quality between the majority of carbon nanotubes 104 and the minority of dispersed carbon nanotubes 106 can be greater than or equal to 2:1 and less than or equal to about 6:1. The more the minority of dispersed carbon nanotubes 106, the greater the maximum deformation of the carbon nanotube film 100 along D2. The maximum deformation of the carbon nanotube film 100 along D2 can be about 300%. In one embodiment, the ratio of quantity between the majority of carbon nanotubes 104 and the minority of dispersed carbon nanotubes 106 is about 4:1.

The carbon nanotube film 100 can be made by following substeps:

step (S100), providing a carbon nanotube array on a substrate; and step (S102), drawing out the carbon nanotube film 100 from the carbon nanotube array by using a tool.

In step (S100), the carbon nanotube array includes a plurality of carbon nanotubes that are parallel to each other and substantially perpendicular to the substrate. The height of the plurality of carbon nanotubes can be in a range from about 50 micrometers to 900 micrometers. The carbon nanotube array can be formed by the substeps of: step (S1001) providing a substantially flat and smooth substrate; step (S1002) forming a catalyst layer on the substrate; step (S1003) annealing the substrate with the catalyst layer in air at a temperature approximately ranging from 700° C. to 900° C. for about 30 minutes to 90 minutes; step (S1004) heating the substrate with the catalyst layer to a temperature approximately ranging from 500° C. to 740° C. in a furnace with a protective gas therein; and step (S1005) supplying a carbon source gas to the furnace for about 5 minutes to 30 minutes and growing the carbon nanotube array on the substrate.

In step (S1001), the substrate can be a P-type silicon wafer, an N-type silicon wafer, or a silicon wafer with a film of silicon dioxide thereon. A 4-inch P-type silicon wafer is used as the substrate. In step (S1002), the catalyst can be made of iron (Fe), cobalt (Co), nickel (Ni), or any alloy thereof. In step (S1003), the protective gas can be made up of at least one of nitrogen ($N_2$), ammonia ($NH_3$), and a noble gas. In step (S1005), the carbon source gas can be a hydrocarbon gas, such as ethylene ($C_2H_4$), methane ($CH_4$), acetylene ($C_2H_2$), ethane ($C_2H_6$), or any combination thereof. The carbon nanotube array formed under the above conditions is essentially free of impurities, such as carbonaceous or residual catalyst particles.

In step (S102), the drawing out the carbon nanotube film 100 includes the substeps of: step (S1021) selecting one or more of carbon nanotubes in a predetermined width from the carbon nanotube array; and step (S1022) drawing the selected carbon nanotubes to form nanotube segments at an even and uniform speed to achieve the carbon nanotube film 100.

In step (S1021), the carbon nanotubes having a predetermined width can be selected by using an adhesive tape, such as the tool, to contact the super-aligned array. In step (S1022), the drawing direction is substantially perpendicular to the growing direction of the carbon nanotube array. Each carbon nanotube segment includes a plurality of carbon nanotubes parallel to each other.

In one embodiment, during the drawing process, as the initial carbon nanotube segments are drawn out, other carbon nanotube segments are also drawn out end-to-end due to van der Waals force between ends of adjacent segments. This process of drawing helps provide a continuous and uniform carbon nanotube film 100 having a predetermined width can be formed.

The width of the carbon nanotube film 100 depends on a size of the carbon nanotube array. The length of the carbon nanotube film 100 can be arbitrarily set as desired. In one useful embodiment, when the substrate is a 4-inch P-type silicon wafer, the width of the carbon nanotube film 100 can be in a range from about 0.01 centimeters to about 10 centimeters. The thickness of the carbon nanotube film 100 can be in a range from about 0.5 nanometers to about 10 micrometers.

Figure 6:
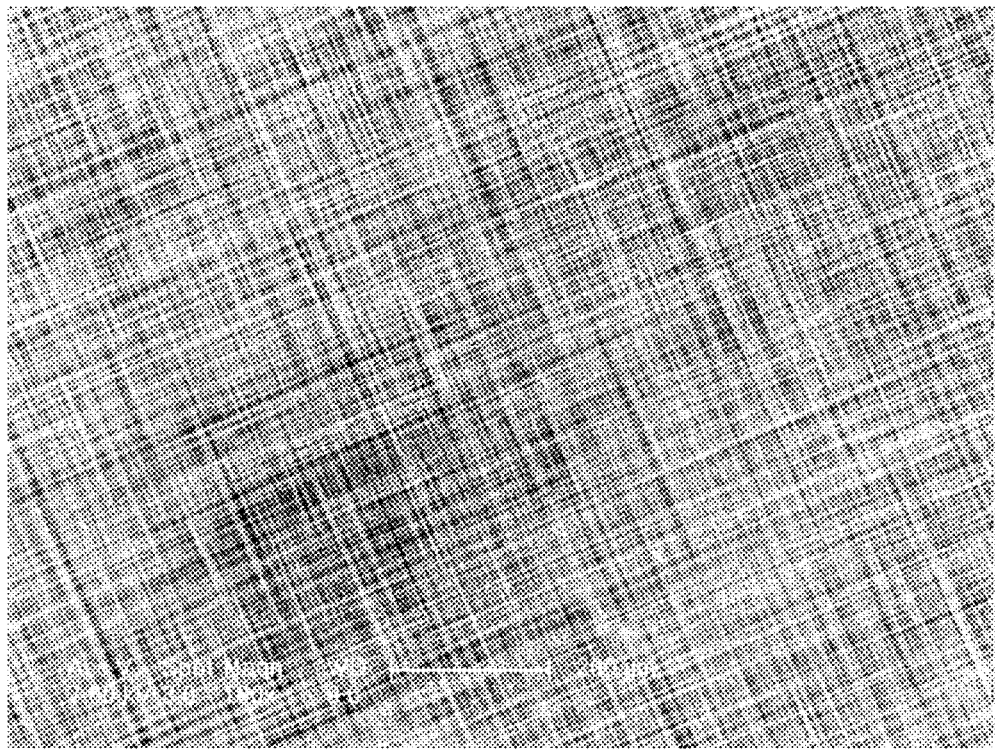
FIG. 6 is an SEM image of two cross-stacked carbon nanotube films.

Furthermore, at least two carbon nanotube films 100 can be stacked with each other or two or more carbon nanotube films 100 can be located coplanarly and combined by only the van der Waals force therebetween. As shown in FIG. 6, two carbon nanotube films 100 are stacked with each other, and the majority of carbon nanotubes 104 of the two carbon nanotube films 100 are substantially perpendicular with each other.

Figure 7:
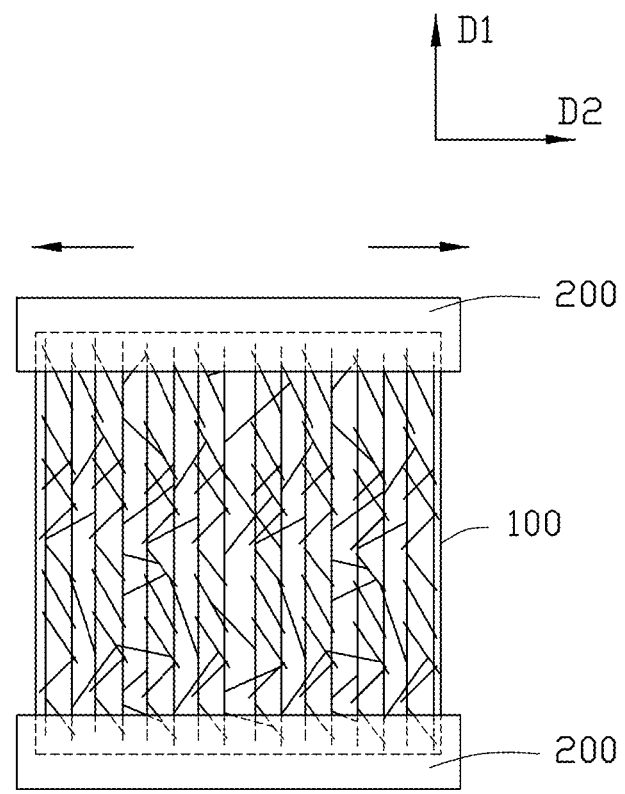
FIG. 7 is schematic view of one embodiment of a method for stretching the carbon nanotube film of FIG. 4.
Figure 8:
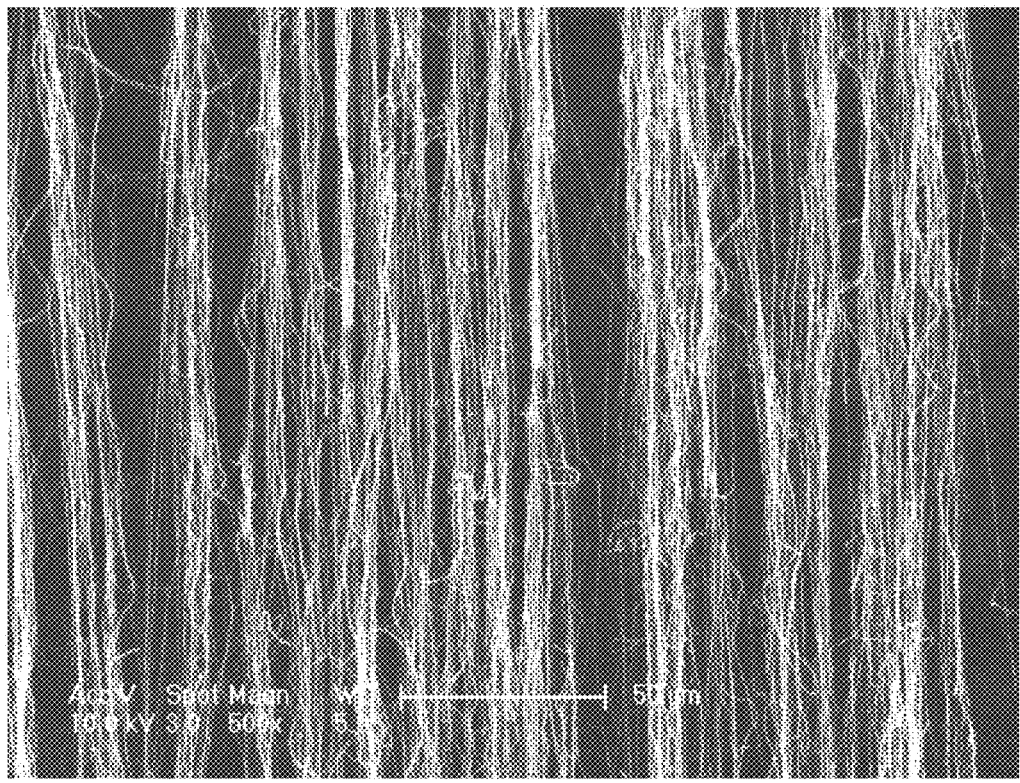
FIG. 8 is an SEM image of a stretched carbon nanotube film made by method of FIG. 7.

Furthermore, in one embodiment, step (S10) further includes stretching the carbon nanotube film 100 along D2 so that the apertures 105 have larger width. As shown in FIG. 7, the stretching the carbon nanotube film 100 includes: fixing two opposite sides of the carbon nanotube film 100 on two spaced elastic supporters 200 so that a portion of the carbon nanotube film 100 are suspended between the two elastic supporters 200, wherein two elastic supporters 200 are parallel with each other and extend along D2; stretching the two elastic supporters 200 along D2 to obtain a stretched carbon nanotube film. As shown in FIG. 8, the stretched carbon nanotube film has increased apertures. The two elastic supporters 200 can be elastic rubber, springs, or elastic bands. The speed of stretching the two elastic supporters 200 is less than 10 centimeters per second. The area of the carbon nanotube film 100 can be increased by stretching along D2.

Furthermore, in one embodiment, step (S10) can further include treating the carbon nanotube film 100 with organic solvent so that the apertures 105 have larger width. The organic solvent can be volatile, such as ethanol, methanol, acetone, dichloroethane, chloroform, or mixtures thereof. In one embodiment, the organic solvent is ethanol. The treating the carbon nanotube film 100 with organic solvent can be performed by applying the organic solvent to entire surface of the carbon nanotube film 100 suspended on a frame or immersing the entire carbon nanotube film 100 with the frame in an organic solvent.

In one embodiment, the treating the carbon nanotube film 100 with organic solvent includes soaking a suspended carbon nanotube film 100 with an atomized organic solvent at least one time. In one embodiment, the soaking a suspended carbon nanotube film 100 can include steps of: providing a volatilizable organic solvent; atomizing the organic solvent into a plurality of dispersed organic droplets; and spraying the organic droplets onto the surface of the suspended carbon nanotube film 100 and the organic droplets gradually penetrating onto the carbon nanotubes of the carbon nanotube film 100, thereby making the suspended carbon nanotube film 100 be soaked at least one time by the organic droplets, and then make the carbon nanotube film shrink into a treated carbon nanotube film. The organic droplets are tiny organic solvent drops suspended in surrounding. The organic solvent can be atomized into the organic droplets by ultrasonic atomization method, high pressure atomizing method or other methods.

The organic solvent can be alcohol, methanol, acetone, acetic acid, and other volatilizable solvents. During the spraying process, a pressure is produced, when the organic droplets are sprayed, the pressure is small and can't break the carbon nanotube film 100. The diameter of each organic droplet is larger than or equal to 10 micrometers, or less than or equal to 100 micrometers, such as about 20 micrometers, 50 micrometers. Thus, an interface force is produced between the carbon nanotube film 100 and the organic droplets. The interface force can ensure that the carbon nanotube film 100 is shrunk and the carbon nanotubes in the carbon nanotube film 100 are dispersed more uniformly.

The organic solvent is volatile and easy to be volatilized. When the organic droplets are sprayed onto the carbon nanotube film 100 and then penetrated into the carbon nanotube film 100, the organic droplets are then volatilized, and the carbon nanotube segments 108 loosely arranged in the carbon nanotube film 100 are tightly shrunk. The diameter of each organic droplet is larger than or equal to 10 micrometers, or less than or equal to 100 micrometers, the soaked scope of the carbon nanotube segment of the carbon nanotube film 100 is limited by the small diameter of each organic droplet. Thus, diameters of the carbon nanotube segments 108 of the carbon nanotube film 100 can be shrunk into less than or equal to 10 micrometers, the carbon nanotube segments 108 are substantially invisible using naked eyes in the treated carbon nanotube film. The carbon nanotube film 100 is original black or grey. However, after the soaking with an atomized organic solvent, the carbon nanotube film 100 is shrunk into the treated carbon nanotube film which is more transparent.

In step (S20), the carbon nanotube film 100 can be suspended and treated by oxidization or carbon accumulation to induce defects. In one embodiment, part of the carbon nanotube film 100 is suspended by attaching on a frame and oxidized by oxygen plasma treating.

Figure 9:
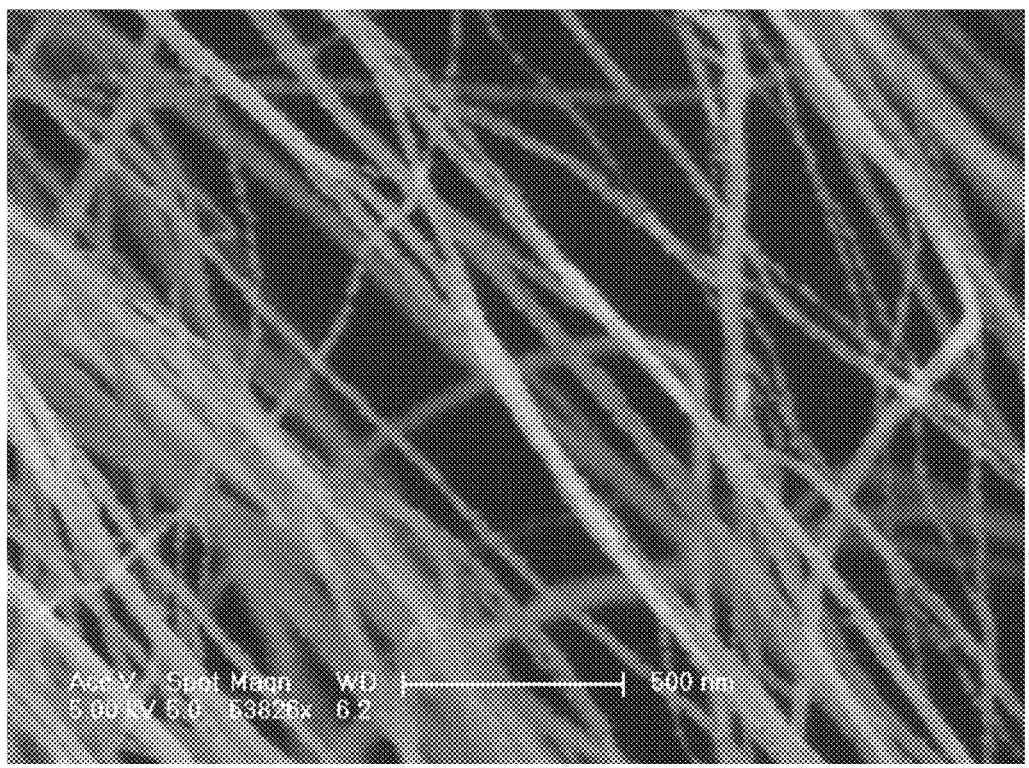
FIG. 9 is an SEM image of one embodiment of an alumina ($Al_2O_3$) layer deposited on a carbon nanotube film not treated with oxygen plasma by atomic layer deposition (ALD).
Figure 10:
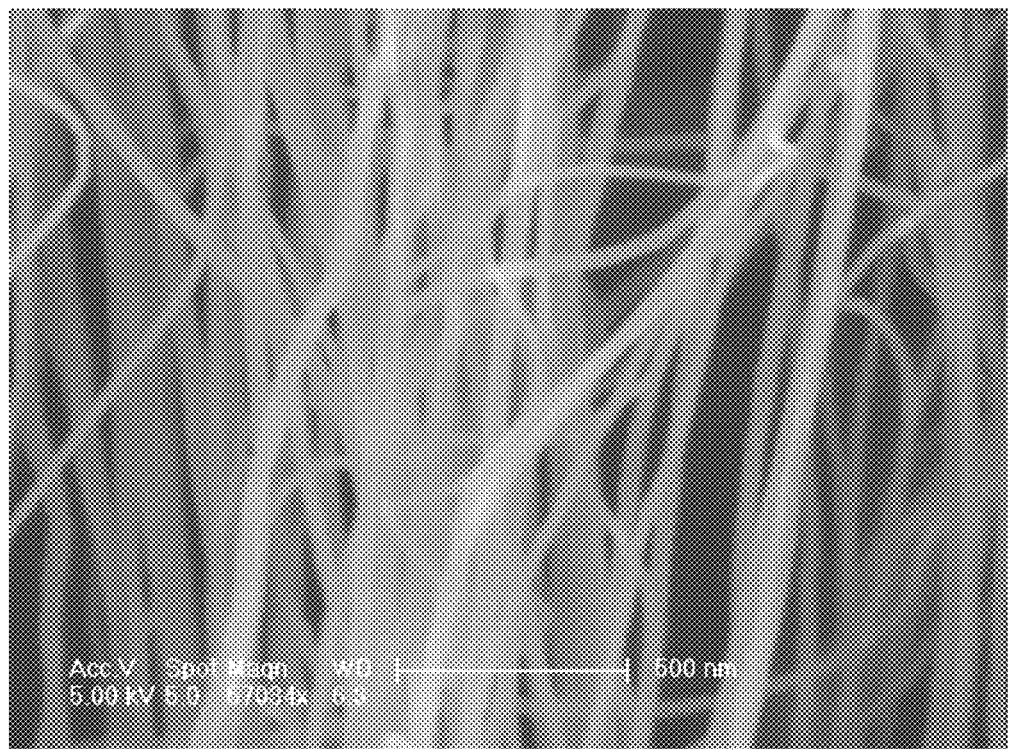
FIG. 10 is an SEM image of one embodiment of an alumina layer deposited on a carbon nanotube film treated with oxygen plasma by atomic layer deposition.

In the process of treating the carbon nanotube film 100 by oxygen plasma, the carbon nanotubes 104, 106 of the carbon nanotube film 100 are destroyed to form a plurality of dangling bond. In the process of oxygen plasma, the carbon nanotube film 100 can be connected to a power and has an electric potential so that the carbon nanotube film 100 can be bombard by the oxygen plasma more strongly. When nano-material layer 110 are forming on the surface of the carbon nanotubes 104, 106 by atomic layer deposition, the atoms of the nano-material layer 110 can stack on the surface of the carbon nanotubes 104, 106 layer upon layer to form a compact nano-material layer 110 with high strength. Also, the thickness of the nano-material layer 110 is controllable so that a nano-material layer 110 with a thickness in nano-scale can be obtained. In the process of oxygen plasma, the flow rate of the oxygen gas can be in a range from about 30 sccm to about 60 sccm, the pressure of the oxygen gas can be in a range from about 8 Pa to about 12 Pa, the treating time can be in a range from about 8 seconds to about 12 seconds, and the treating power can be in a range from about 20 W to about 30 W. In one embodiment, the flow rate of the oxygen gas is about 50 sccm, the pressure of the oxygen gas is about 10 Pa, the treating time is about 10 seconds, and the treating power is about 25 W. As shown in FIG. 9, if the carbon nanotube film is not treated with oxygen plasma, the alumina layer deposited on the carbon nanotube film by atomic layer deposition is a plurality of discontinuous particles. However, as shown in FIG. 10, if the carbon nanotube film is treated with oxygen plasma, the alumina layer deposited on the carbon nanotube film by atomic layer deposition is a continuous layer structure.

Figure 11:
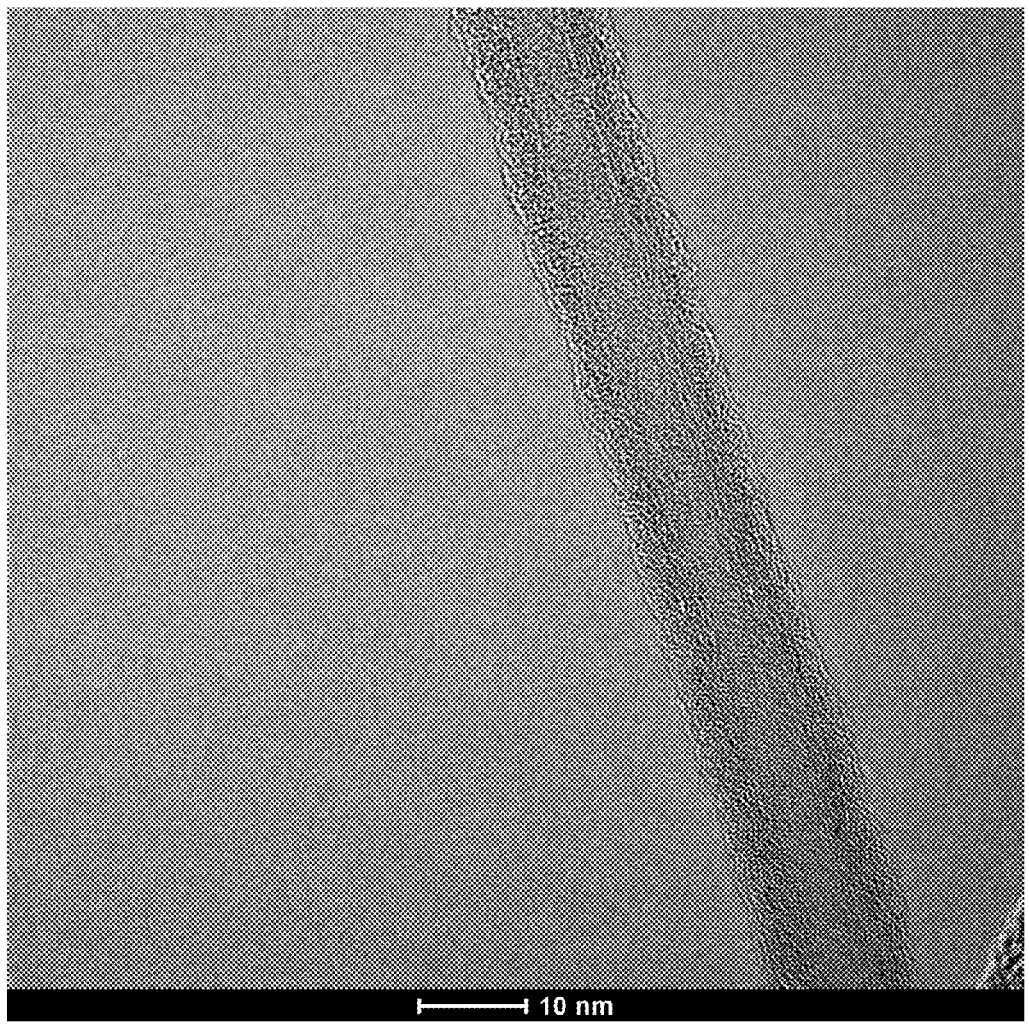
FIG. 11 is a transmission electron microscope (TEM) image of one embodiment of a carbon nanotube film treated by carbon accumulation.

In the process of carbon accumulation, a carbon layer is coated on the surface of the carbon nanotubes 104, 106. The method of carbon accumulation can be physical vapor deposition (PVD), chemical vapor deposition (CVD), or spraying. In the process of carbon accumulation, an electric current can be supplied to flow through the carbon nanotube film 100 to produce heat to heat the carbon nanotube film 100 itself. In one embodiment, the carbon layer is coated on the surface of the carbon nanotubes 104, 106 by magnetron sputtering. In the magnetron sputtering, the current can be in a range from about 100 mA to about 200 mA, the pressure can be in a range from about 0.05 Pa to about 0.2 Pa, the flow rate of Ar can be in a range from about 5 Pa to about 15 sccm, and the sputtering time can be in a range from about 1.5 minutes to about 7.5 minutes. In one embodiment, the current is about 150 mA, the pressure is about 0.1 Pa, the flow rate of Ar is about 10 sccm, and the sputtering time is about 5 minutes. As shown in FIG. 11, the carbon layer is coated on the surface of the carbon nanotubes of the carbon nanotube film 100 by magnetron sputtering.

Figure 12:
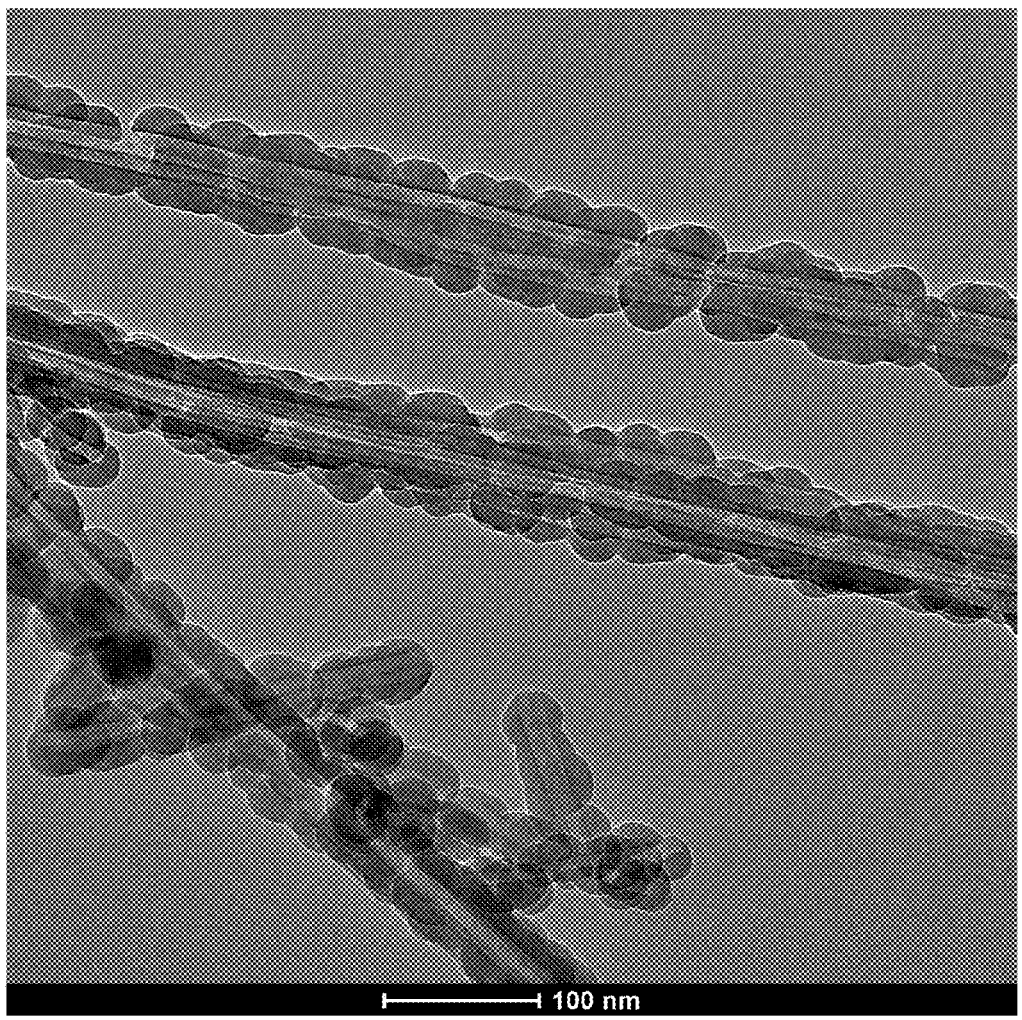
FIG. 12 is an SEM image of one embodiment of an alumina layer deposited on a carbon nanotube film not treated by carbon accumulation by atomic layer deposition.
Figure 13:
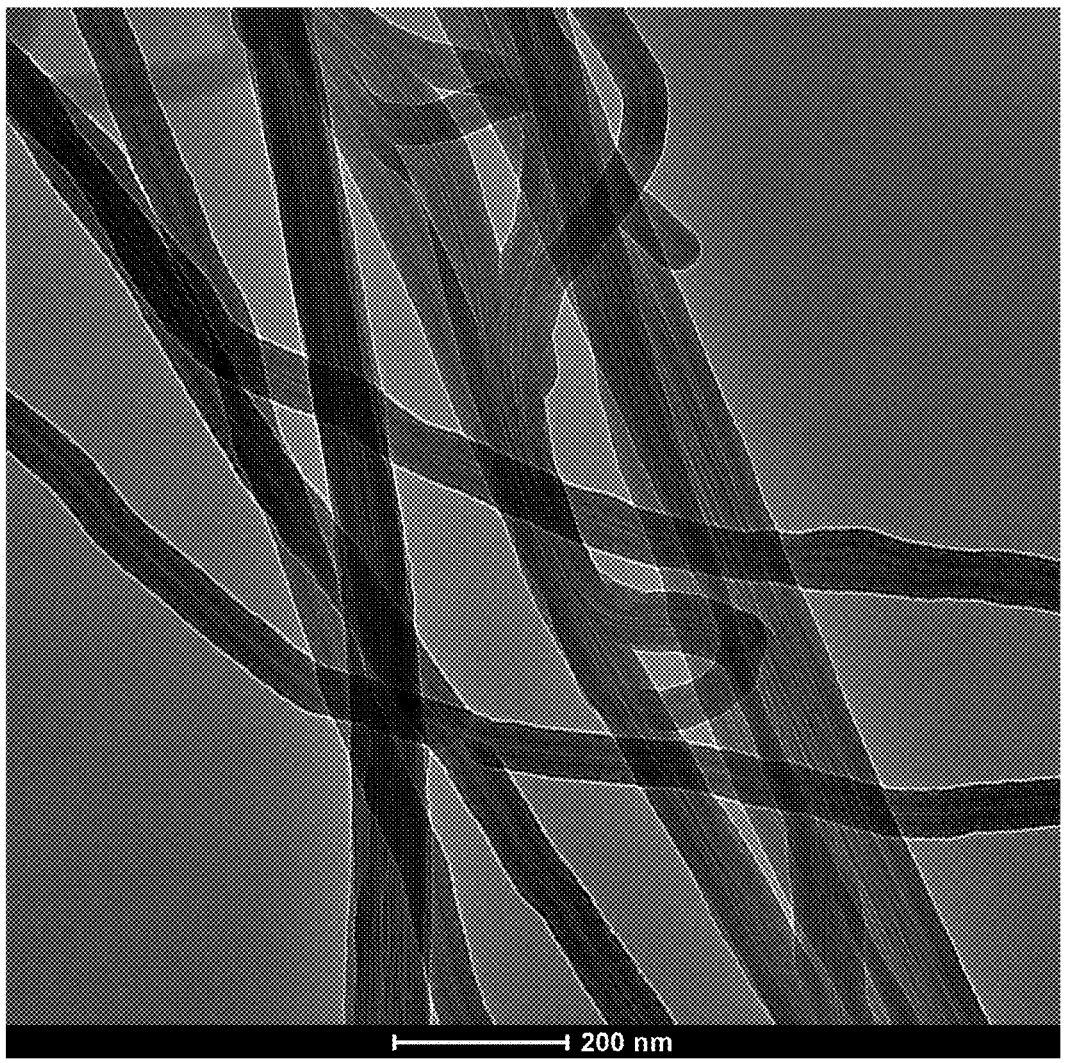
FIG. 13 is an SEM image of one embodiment of an alumina layer deposited on a carbon nanotube film treated with oxygen plasma by atomic layer deposition.

The carbon layer includes a plurality of carbon particles to form the defects on the surface of the carbon nanotubes 104, 106. Thus, when nano-material layer 110 are forming on the surface of the carbon nanotubes 104, 106 by atomic layer deposition, the atoms of the nano-material layer 110 can stack on the surface of the carbon nanotubes 104, 106 layer upon layer to form a compact nano-material layer 110 with high strength. Also, the thickness of the nano-material layer 110 is controllable so that a nano-material layer 110 with a thickness in nano-scale can be obtained. The thickness of the nano-material layer 110 can be in a range from about 10 nanometers to about 30 nanometers. If the carbon nanotube film 100 is not treated by carbon accumulation, the alumina layer deposited on the carbon nanotube film by atomic layer deposition can form a continuous layer structure only at the thickness above 30 nanometers. If the thickness of the alumina layer deposited on the carbon nanotube film by atomic layer deposition is smaller than 30 nanometers, the alumina layer is a plurality of discontinuous particles attached on the surface of the carbon nanotubes 104, 106. Thus, the alumina layer cannot form a compact layer structure. As shown in FIG. 12, if the carbon nanotube film 100 is not treated with carbon accumulation, the alumina layer deposited on the carbon nanotube film by atomic layer deposition is a plurality of discontinuous particles. However, as shown in FIG. 13, if the carbon nanotube film is treated with carbon accumulation, the alumina layer deposited on the carbon nanotube film by atomic layer deposition is a continuous layer structure.

In step (S30), the source material of the atomic layer deposition can be selected according to the material of the nanotubes 112. For example, when the nanotubes 112 are metal oxide nanotubes 112, the source material of the atomic layer deposition includes metal organic compound and water, and the carrier gas is nitrogen gas. The thickness of the nano-material layer 110 can be in a range from about 10 nanometers to about 100 nanometers. In one embodiment, the thickness of the nano-material layer 110 is in a range from about 20 nanometers to about 50 nanometers. The nano-material layer 110 can be coated on a surface of a single carbon nanotube to form a continuous layer structure and enclose the single carbon nanotube therein. The nano-material layer 110 can also be coated on a surface of two or more than two carbon nanotubes to form a continuous layer structure and enclose the two or more than two carbon nanotubes therein. The nano-material layer 110 can form a plurality of nanotubes 112 after the carbon nanotubes therein are removed because the nano-material layer 110 is a compact continuous layer structure. The plurality of nanotubes 112 can be combined with each other to form a free-standing nanotube film 114. The nanotube 112 can be a single linear nanotube or a branch nanotube. The material of the nano-material layer 110 can be metal oxide, metal nitride, metal carbide, silicon oxide, silicon nitride, or silicon carbide.

In one embodiment, an alumina layer is deposited on the carbon nanotube film 100 by atomic layer deposition, the source materials of the atomic layer deposition are trimethylaluminum and water, and the carrier gas is nitrogen gas. The alumina layer is deposited on the carbon nanotube film 100 by following steps:

step (S301), suspending a portion of the carbon nanotube film 100 in a vacuum chamber of a atomic layer deposition device; and step (S302), alternately introducing trimethylaluminum and water in to the chamber of the atomic layer deposition device.

In step (S301), the carbon nanotube film 100 is attached on a frame so that a portion of the carbon nanotube film 100 is suspended, and then placed into the vacuum chamber with the frame together. The frame can be a metal or ceramic frame. Because the carbon nanotube film 100 is free standing, the carbon nanotube film 100 can be direct placed on two spaced supporters located in the vacuum chamber. When the elastic supporters 200 mentioned above are made of thermostable material, the stretched carbon nanotube film 100 and the elastic supporters 200 can be placed in the vacuum chamber together.

In step (S302), the carrier gas is nitrogen gas. The flow rate of the carrier gas is about 5 sccm. The alternately introducing trimethylaluminum and water includes following steps:

step (S3021), first evacuating the vacuum chamber to a pressure of about 0.23 Torr;

step (S3022), introducing trimethylaluminum in to the vacuum chamber until the pressure of the vacuum chamber rises to about 0.26 Torr;

step (S3023), second evacuating the vacuum chamber to the pressure of about 0.23 Torr;

step (S3024), introducing water in to the vacuum chamber until the pressure of the vacuum chamber rise to about 0.26 Torr;

step (S3025), third evacuating the vacuum chamber to the pressure of about 0.23 Torr; and step (S3026), repeating step (S3022) to step (S3025) to start another cycle.

In each cycle, the second evacuating the vacuum chamber to the pressure of about 0.23 Ton takes about 25 seconds, and the third evacuating the vacuum chamber to the pressure of about 0.23 Ton takes about 50 seconds. The deposition velocity of the alumina layer is about 0.14 nm/cycle. The thickness of the alumina layer can be controlled by the cycle number.

In step (S40), the carbon nanotube film 100 coated with nano-material layer 110 is annealed to remove the carbon nanotube film 100 and obtain the plurality of nanotubes 112. The plurality of nanotubes 112 are orderly arranged and combined with each other to form the free-standing nanotube film 114. The annealing can be performed in oxygen atmosphere and at a temperature in a range from about 500° C. to about 1000° C. In one embodiment, the carbon nanotube film 100 coated with nano-material layer 110 is suspended in a quartz tube filled with air and heated to 550° C.

Figure 2:
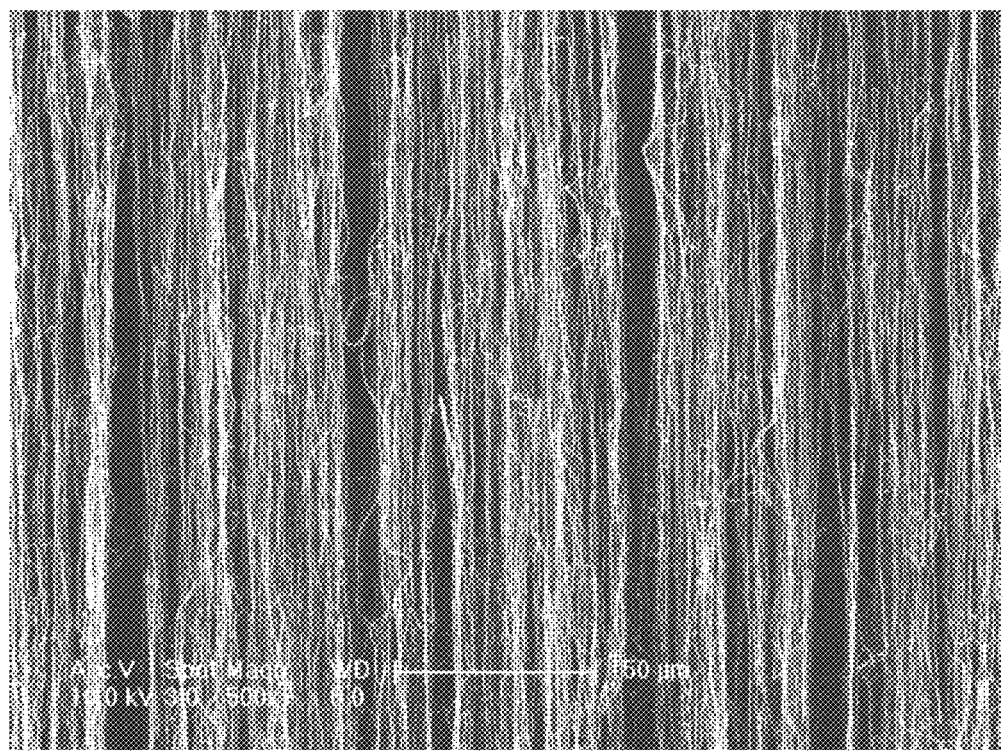
FIG. 2 is a Scanning Electron Microscope (SEM) image of a carbon nanotube film.
Figure 14:
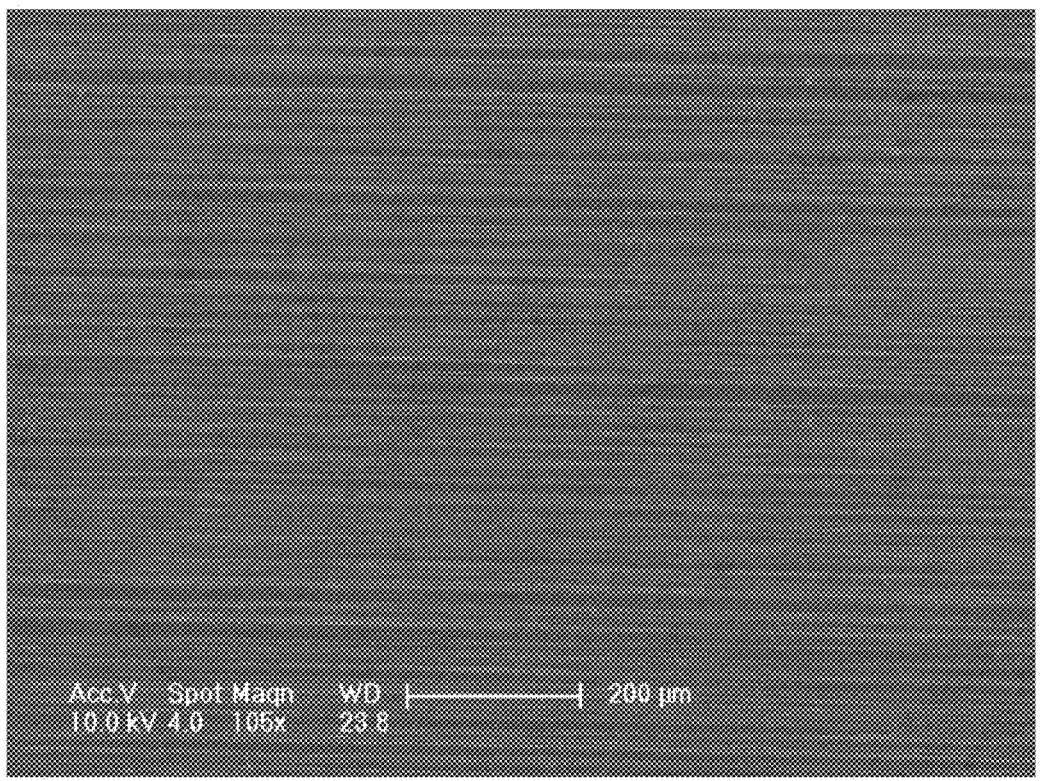
FIG. 14 is an SEM image of one embodiment of a single alumina nanotube film.
Figure 15:
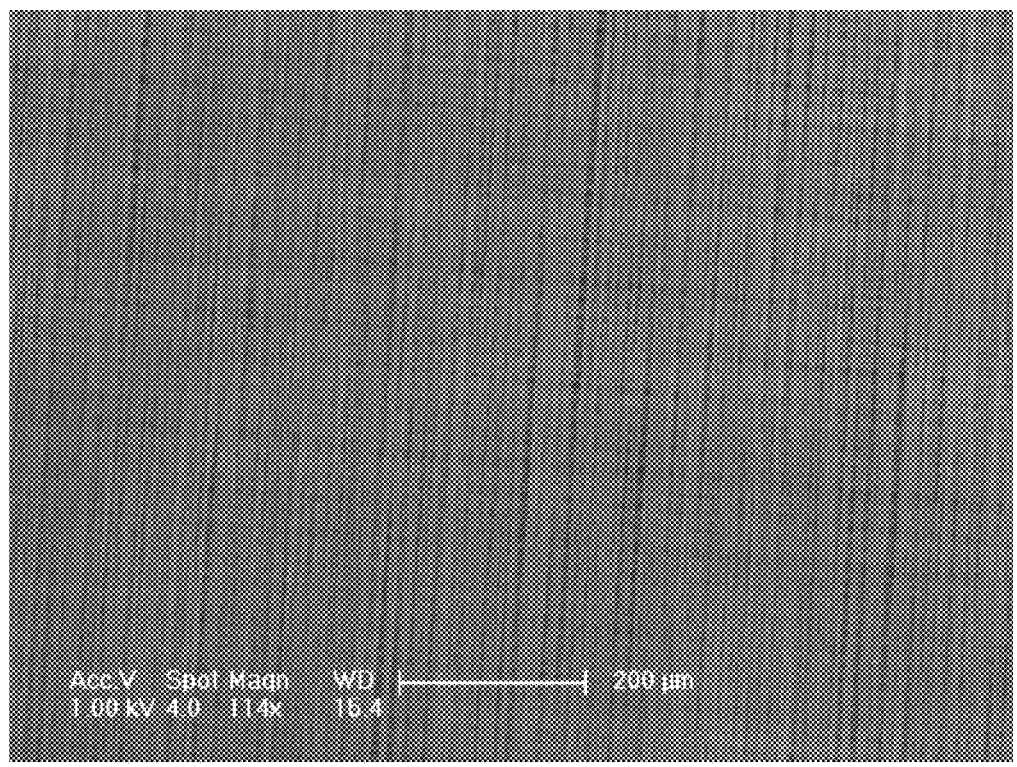
FIG. 15 is an SEM image of one embodiment of two cross-stacked alumina nanotube films.
Figure 16:
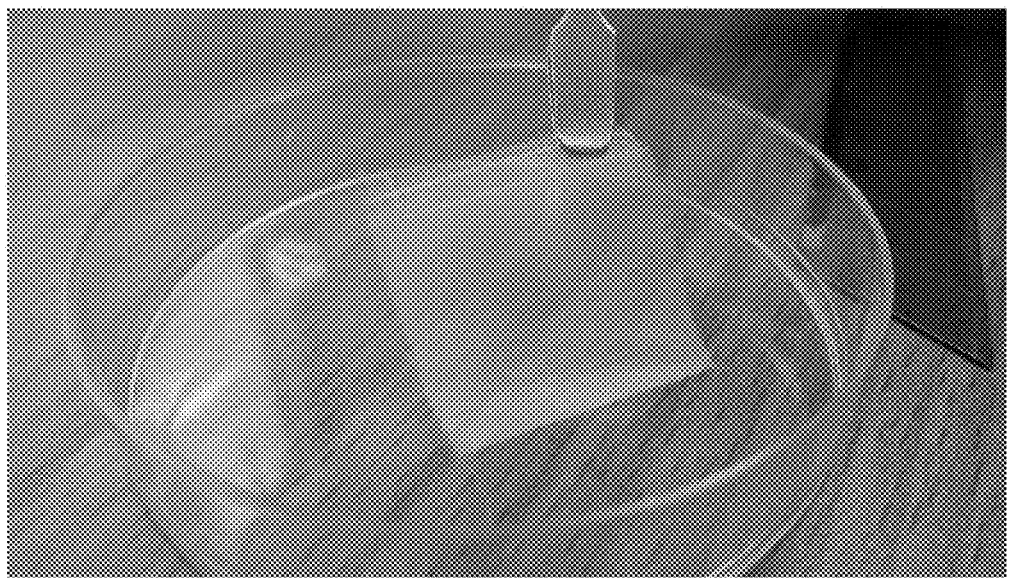
FIG. 16 is a photo of an alumina nanotube film.

Referring to FIGS. 2 and 14, the single alumina nanotube film and the single carbon nanotube film have substantially the same structure. Referring to FIGS. 6 and 15, the two cross-stacked alumina nanotube films and the two cross-stacked carbon nanotube films have substantially the same structure. FIG. 16 shows that the alumina nanotube film is a free-standing nanotube film.

Figure 17:
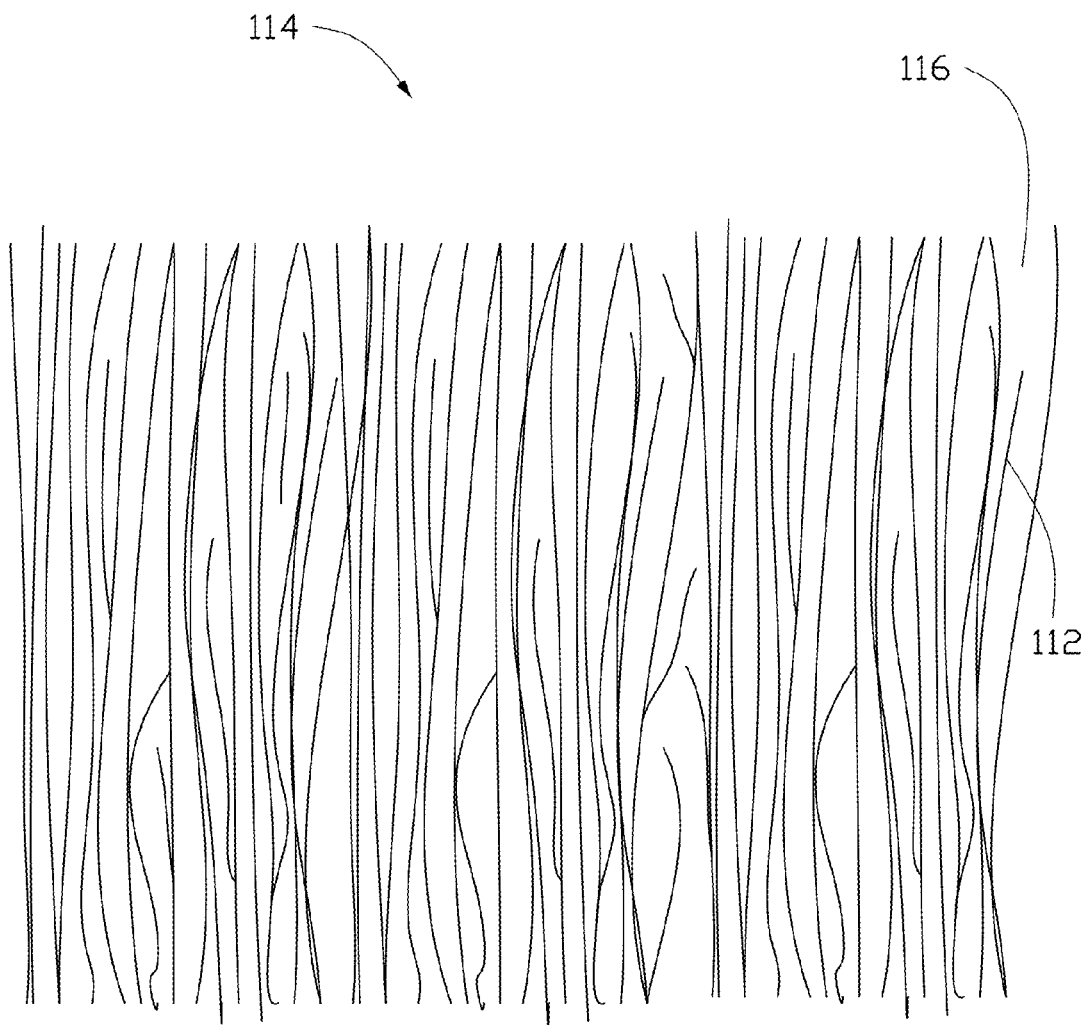
FIG. 17 is a schematic structural view of one embodiment of a single nanotube film.
Figure 18:
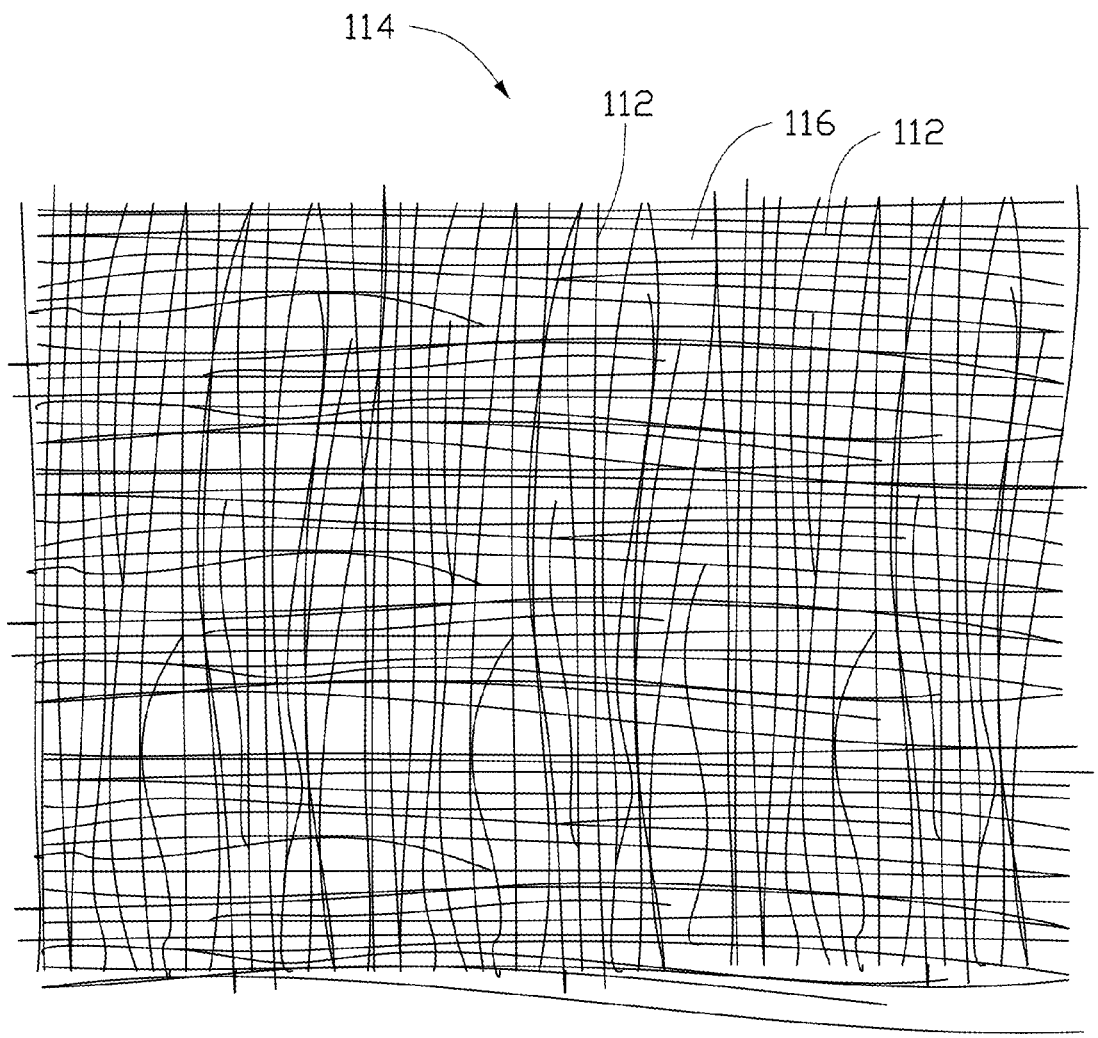
FIG. 18 is a schematic structural view of one embodiment of two cross-stacked nanotube films.

Referring to FIG. 17, the nanotube film 114 includes a plurality of nanotubes 112 orderly arranged and combined with each other. In one embodiment, the plurality of nanotubes 112 are arranged to extend substantially along the same direction. The plurality of nanotubes 112 are spaced from each other or in direct contact with each other. A plurality of apertures 116 are defined by the plurality of spaced nanotubes 112. Thus, the nanotube film 114 is a patterned mask. The plurality of apertures 116 extends through the nanotube film along the thickness direction. The plurality of apertures 116 can be a hole defined by several adjacent nanotubes 112, or a gap defined by two substantially parallel nanotubes 112 and extending along axial direction of the nanotubes 112. The hole shaped apertures 116 and the gap shaped apertures 116 can exist in the patterned nanotube film 114 at the same time. The sizes of the apertures 116 can be different. The average size of the apertures 116 can be in a range from about 10 nanometers to about 500 micrometers. For example, the sizes of the apertures 116 can be about 50 nanometers, 100 nanometers, 500 nanometers, 1 micrometer, 10 micrometers, 80 micrometers, or 120 micrometers. The smaller the sizes of the apertures 116, the less dislocation defects will occur during the process of growing the first semiconductor layer 130. In one embodiment, the sizes of the apertures 116 are in a range from about 10 nanometers to about 10 micrometers. The adjacent nanotubes 112 are combined with each other by ionic bonds at the contacting surface and internal communicated. At least part of the plurality of nanotubes 112 extend from a first side of the nanotube film 114 to a second side opposite to the first side. The majority of nanotubes 112 of the nanotube film 114 are arranged to substantially extend along the same direction and in parallel with the surface of the nanotube film 114. A minority of dispersed nanotubes 112 of the nanotube film 114 may be arranged randomly and in direct contact with the adjacent nanotubes 112. Thus, the nanotube film 114 is a free-standing structure. The thickness of the wall of each nanotube 112 can be in a range from about 10 nanometers to about 100 nanometers. The inside diameter of each nanotube 112 can be in a range from about 1 nanometer to about 100 nanometers. As shown in FIG. 18, two nanotube films 114 can be stacked with each other. The extending directions of nanotubes 112 in the two stacked nanotube films 114 are perpendicular with each other. The two stacked nanotube films 114 are combined with each other by ionic bonds.

The nanotube film 114 can be used as a mask for growing the first semiconductor layer 130. The mask is the nanotube film 114 sheltering a part of the epitaxial growth surface 122 and exposing another part of the epitaxial growth surface 122. Thus, the first semiconductor layer 130 can grow from the exposed epitaxial growth surface 122. The nanotube film 114 can form a patterned mask on the epitaxial growth surface 122 because the nanotube film 114 defines a plurality of apertures 116. After the nanotube film 114 is placed on the epitaxial growth surface 122 of the substrate 120, part of the epitaxial growth surface 122 is sheltered by the nanotube film 114, and other part of the epitaxial growth surface 122 is exposed from the plurality of apertures 116. A dutyfactor of the nanotube film 114 is an area ratio between the sheltered epitaxial growth surface 122 and the exposed epitaxial growth surface 122. The dutyfactor of the nanotube film 114 can be in a range from about 1:100 to about 100:1. For example, the dutyfactor of the nanotube film 114 can be about 1:10, 1:2, 1:4, 4:1, 2:1, or 10:1. In one embodiment, the dutyfactor of the nanotube film 114 is in a range from about 1:4 to about 4:1. Compared with lithography or etching, the method of forming a nanotube film 114 as mask is simple, low in cost, and will not pollute the substrate 120.

In step (S50), the epitaxial growth surface 122 can be used to grow the first semiconductor layer 130. The epitaxial growth surface 122 is a clean and smooth surface. The substrate 120 can be a single-layer structure or a multi-layer structure. If the substrate 120 is a single-layer structure, the substrate 120 can be a single crystal structure having a crystal face used as the epitaxial growth surface 122. If the substrate 120 is a multi-layer structure, the substrate 120 should include at least one layer having the crystal face. The material of the substrate 120 can be GaAs, GaN, AN, Si, SOI (silicon on insulator), SiC, MgO, ZnO, LiGaO$_2$, LiAlO$_2$, or Al$_2$O$_3$. The material of the substrate 120 can be selected according to the material of the first semiconductor layer 130. The first semiconductor layer 130 and the substrate 120 should have a small lattice mismatch and a thermal expansion mismatch. The size, thickness, and shape of the substrate 120 can be selected according to need. In one embodiment, the substrate 120 is a sapphire substrate.

After the nanotube film 114 is placed on the epitaxial growth surface 122 of the substrate 120, the plurality of nanotubes 112 extends along a direction parallel with the epitaxial growth surface 122. The plurality of nanotubes 112 can also be arranged to extend along the crystallographic orientation of the substrate 120 or along a direction which forms an angle with the crystallographic orientation of the substrate 120. Part of the epitaxial growth surface 122 is sheltered by the nanotube film 114, and part of the epitaxial growth surface 122 is exposed from the plurality of apertures 116. In one embodiment, the nanotube film 114 is placed on the entire epitaxial growth surface 122.

In step (S60), the nanotube film 114 is used as a mask for growing the first semiconductor layer 130, the active layer 140 and the second semiconductor layer 150. The mask can shelter a part of the epitaxial growth surface 122 and exposing another part of the epitaxial growth surface 122. Thus, the first semiconductor layer 130 can grow from the exposed epitaxial growth surface 122. Compared to lithography or etching, the method of using the nanotube film 114 as mask is simple, low in cost, and will not pollute the substrate 120.

The first semiconductor layer 130, the active layer 140 and the second semiconductor layer 150 are single crystal semiconductor layer grown on the epitaxial growth surface 122 by epitaxy growth method. The material of the first semiconductor layer 130 can be the same as or different from the material of the substrate 120. If the first semiconductor layer 130 and the substrate 120 are the same material, the first semiconductor layer 130 is called as a homogeneous epitaxial layer. If the first semiconductor layer 130 and the substrate 120 have different material, the first semiconductor layer 130 is called as a heteroepitaxial epitaxial layer. The first semiconductor layer 130 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD). In one embodiment, the first semiconductor layer 130, the active layer 140 and the second semiconductor layer 150 are grow by the same method.

The first semiconductor layer 130 and the second semiconductor layer 150 are a doped semiconductor epitaxial layer such as an N-type semiconductor layer or a P-type semiconductor layer. The N-type semiconductor layer is configured to produce electrons and the P-type semiconductor layer is configured to produce holes. The active layer 140 is a photon excitation layer and can be one of a single layer quantum well film or multilayer quantum well films. The material of the quantum well can be indium gallium nitride, indium gallium aluminum nitride, gallium arsenide, aluminum gallium arsenide, indium phosphide, gallium, indium phosphide, arsenic, or indium arsenide and gallium. The first semiconductor layer 130, the active layer 140, and the second semiconductor layer 150 are stacked on the epitaxial growth surface 122. The active layer 140 is sandwiched between the first semiconductor layer 130 and the second semiconductor layer 150.

The thickness of the first semiconductor layer 130 can be in a range from about 0.5 nanometers to about 5 micrometers. For example, the thickness of the first semiconductor layer 130 can be about 10 nanometers, 100 nanometers, 1 micrometer, 2 micrometers, or 3 micrometers. The thickness of the second semiconductor layer 150 can be in a range from about 0.1 micrometers to about 3 micrometers. For example, the thickness of the second semiconductor layer 150 can be about 0.3 micrometers, 1 micrometer, 2 micrometers, or 3 micrometers. The thickness of the active layer 140 can be in a range from about 0.1 micrometers to about 0.5 micrometers. In one embodiment, the thickness of the active layer 140 is about 0.3 micrometers.

In one embodiment, the first semiconductor layer 130 is a Si doped N-type GaN layer, the active layer 140 is a composite layer of InGaN/GaN and the second semiconductor layer 150 is a Mg doped P-type GaN layer. The substrate 120 is sapphire substrate. The first semiconductor layer 130, the active layer 140 and the second semiconductor layer 150 are grown on the sapphire substrate by MOCVD method and doped via introducing different doped gas into the source gas. The first semiconductor layer 130, the active layer 140 and the second semiconductor layer 150 can grow in series by changing the doped gas and controlling the grow time.

In example, the nitrogen source gas is high-purity ammonia ($NH_3$), the Ga source gas is trimethyl gallium (TMGa) or triethyl gallium (TEGa), the Si source gas is silane ($SiH_4$), the Mg source gas is ferrocene magnesium ($Cp_2Mg$), the In source gas trimethyl indium (TMIn), and the carrier gas is hydrogen ($H_2$) or nitrogen ($N_2$). The step (S60) includes the following sub steps:

step (S601), locating the sapphire substrate 120 with the nanotube film 114 thereon into a reaction chamber, heating the sapphire substrate 120 to about 1100° C. to about 1200° C., introducing the carrier gas, and baking the sapphire substrate for about 200 seconds to about 1000 seconds;

step (S602), growing a low-temperature GaN buffer layer with a thickness of about 10 nanometers to about 50 nanometers by cooling down the temperature of the reaction chamber to a range from about 500° C. to 650° C. in the carrier gas atmosphere, and introducing the Ga source gas and the nitrogen source gas at the same time;

step (S603), stopping the flow of the Ga source gas while maintaining the flow of the carrier gas and nitrogen source gas atmosphere, increasing the temperature to a range from about 1100° C. to about 1200° C., and annealing for about 30 seconds to about 300 seconds;

step (S604), maintaining the temperature of the reaction chamber in a range from about 1000° C. to about 1100° C., and reintroducing the Ga source gas and Si source gas to grow a high quality Si doped N-type GaN epitaxial layer as the first semiconductor layer 130;

step (S605), stopping the flow of the Si source gas, changing the temperature of the reaction chamber to about 700° C. to about 900° C., and changing the pressure of the reaction chamber on about 50 Torr to about 500 Torr;

step (S606), introducing the In source gas into the reaction chamber to grow multilayer quantum well of InGaN/GaN as the active layer 140 while maintaining temperature and pressure of the reaction chamber in step (S605);

step (S607), stopping the flow of the In source gas, changing the temperature of the reaction chamber to about 1000° C. to about 1100° C., and changing the pressure of the reaction chamber on about 76 Ton to about 200 Ton; and step (S608), introducing the Mg source gas into the reaction chamber to grow a high quality Mg doped P-type GaN epitaxial layer as the second semiconductor layer 150 while maintaining temperature and pressure of the reaction chamber in step (S607)

Figure 19:
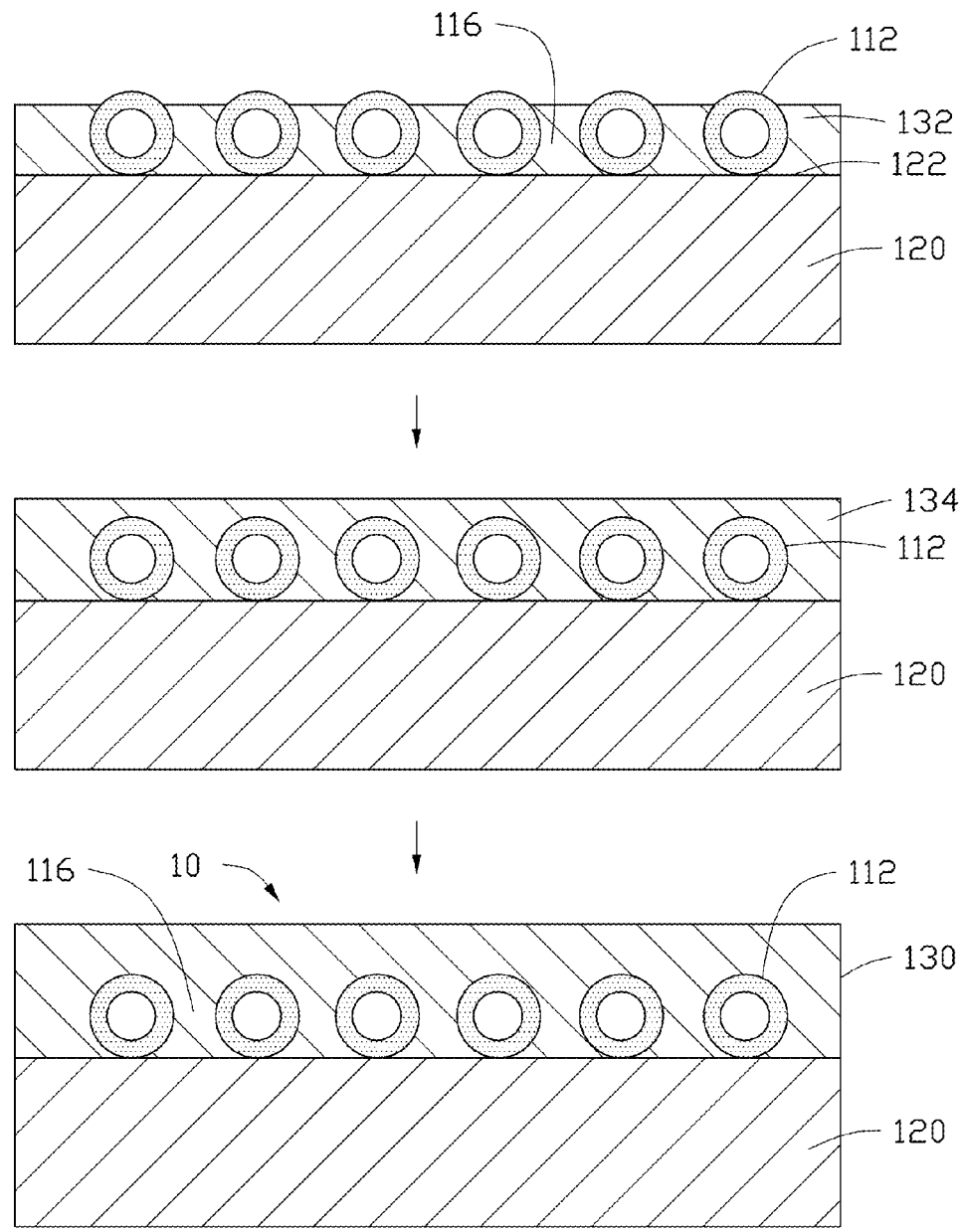
FIG. 19 is a schematic view of one embodiment of growing a first semiconductor layer.

Referring to FIG. 19, in step (S604), the growth of the first semiconductor layer 130 can include the following stages:

step (S6041), nucleating on the epitaxial growth surface 122 and growing a plurality of epitaxial crystal grains 132 along the direction substantially perpendicular to the epitaxial growth surface 122;

step (S6042), forming a continuous epitaxial film 134 by making the epitaxial crystal grains 132 grow along the direction substantially parallel to the epitaxial growth surface 122; and step (S6043), forming the first semiconductor layer 130 by making the epitaxial film 134 grow along the direction substantially perpendicular to the epitaxial growth surface 122.

In step (S6041), the epitaxial crystal grains 132 grow from the exposed part of the epitaxial growth surface 122 and through the apertures 116. The process of the epitaxial crystal grains 132 growing along the direction substantially perpendicular to the epitaxial growth surface 122 is called vertical epitaxial growth.

In step (S6042), the epitaxial crystal grains 132 are joined together to form an integral structure (the epitaxial film 134) to cover the nanotube film 114. The epitaxial crystal grains 132 grow and form a plurality of caves to enclose the nanotubes 112 of the nanotube film 114. The inner wall of the caves can be in contact with or spaced from the nanotubes 112, depending on whether the material of the epitaxial film 134 and the nanotubes 112 have mutual infiltration. Thus, the epitaxial film 134 defines a patterned depression on the surface adjacent to the epitaxial growth surface 122. The patterned depression is related to the patterned nanotube film 114. If nanotube film 114 includes a layer of parallel and spaced nanotubes 112, the patterned depression is a plurality of parallel and spaced grooves. If the nanotube film 114 includes a plurality of nanotubes 112 crossed or weaved together to form a net, the patterned depression is a groove network including a plurality of intersected grooves. The nanotube film 114 can prevent lattice dislocation between the epitaxial crystal grains 132 and the substrate 120 from growing. The process of epitaxial crystal grains 132 growing along the direction substantially parallel to the epitaxial growth surface 122 is called lateral epitaxial growth.

In step (S6043), the first semiconductor layer 130 is obtained by growing for a long duration of time. Because the nanotube film 114 can prevent the lattice dislocation between the epitaxial crystal grains 132 and the substrate 120 from growing, the first semiconductor layer 130 has fewer defects therein.

In step (S70), the active layer 140 and the second semiconductor layer 150 can be etched by the following steps:

step (S701) coating a layer of photo resist uniformly on the second semiconductor layer 150;

step (S702) prebaking the photo resist in a temperature ranging from about 80° C. to about 100° C. for about 20 minutes to about 30 minutes;

step (S703) exposing and developing the photo resist;

step (S704) baking the photo resist in a temperature ranging from about 100° C. to about 150° C. for about 20 minutes to about 30 minutes;

step (S705) corroding the active layer 140 and the second semiconductor layer 150 to form a predetermined figure; and step (S706) removing the photo resist by immersing the photo resist into a solvent.

The step (S703) can further include the following substeps:

step (S7031) placing a mask layer on the surface of the second semiconductor layer 150;

step (S7032) irradiating the first semiconductor layer 130, the active layer 140 and the second semiconductor layer 150 using ultraviolet;

step (S7033) immersing the first semiconductor layer 130, the active layer 140 and the second semiconductor layer 150 into a developer for about 30 minutes to obtain a patterned photo resist.

In step (80), the first electrode 160 and the second electrode 170 can be an N-type electrode or a P-type electrode. The thickness of the first electrode 160 and the second electrode 170 ranges from about 0.01 micrometers to about 2 micrometers. The material of the first electrode 160 and the second electrode 170 can be titanium (Ti), silver (Ag), aluminum (Al), nickel (Ni), gold (Au), or any combination of them. The material of the first electrode 160 and the second electrode 170 can also be indium-tin oxide (ITO), graphene film or carbon nanotube film. The first electrode 160 can cover the entire surface or a part of the surface of the second semiconductor layer 150. The first electrode 160 and the second electrode 170 can be made by an etching process with a mask layer.

When the material of the first electrode 160 and the second electrode 170 is a metal or alloy, the material can be selected separately according to the semiconductor layer electrically connected with the first electrode 160. Thus the contact resistance will be reduced. The first electrode 160 and the second electrode 170 can be deposited via a process of physical vapor deposition, such as electron beam evaporation, vacuum evaporation, ion sputtering, or any physical deposition. While the light is extracted from the second semiconductor layer 150, the first electrode 160 should only cover a part of the surface of the second semiconductor layer 150. The ratio of the surface of the second semiconductor layer 150 which is covered by the first electrode 160 in a range from about 10% to about 15%. The second electrode 170 covers part of the exposed first semiconductor layer 130.

When the material of the first electrode 160 and the second electrode 170 is ITO, the first electrode 160 and the second electrode 170 can be deposited via magnetron sputtering, evaporation, spraying, or sol-gel method. The first electrode 160 can cover the entire surface of the second semiconductor layer 150, and the second electrode 170 can also cover the entire exposed first semiconductor layer 130.

In one embodiment, the first electrode 160 comprises an Au film of 15 nanometers and a Ti film of 100 nanometers. The second electrode 170 comprises an Au film of 15 nanometers and a Ti film of 200 nanometers.

In another embodiment, the nanotube film 114 can be placed between the first semiconductor layer 130 and the active layer 140 or between the active layer 140 and the second semiconductor layer 150. When the nanotube film 114 is placed between the active layer 140 and the second semiconductor layer 150, the second semiconductor layer 150 will form a patterned depression on a surface adjacent to the active layer 140 to enclose the nanotube film 114 therein.

The method for making the light emitting diode 10 has many advantages. The process or growing semiconductor layers is simple, low in cost, and will not pollute the substrate because no lithography and etching is introduced. The light extraction efficiency of the light emitting diode 10 is improved because the nanotube film 114 has a lower light absorption than that of the carbon nanotube film.

Figure 20:
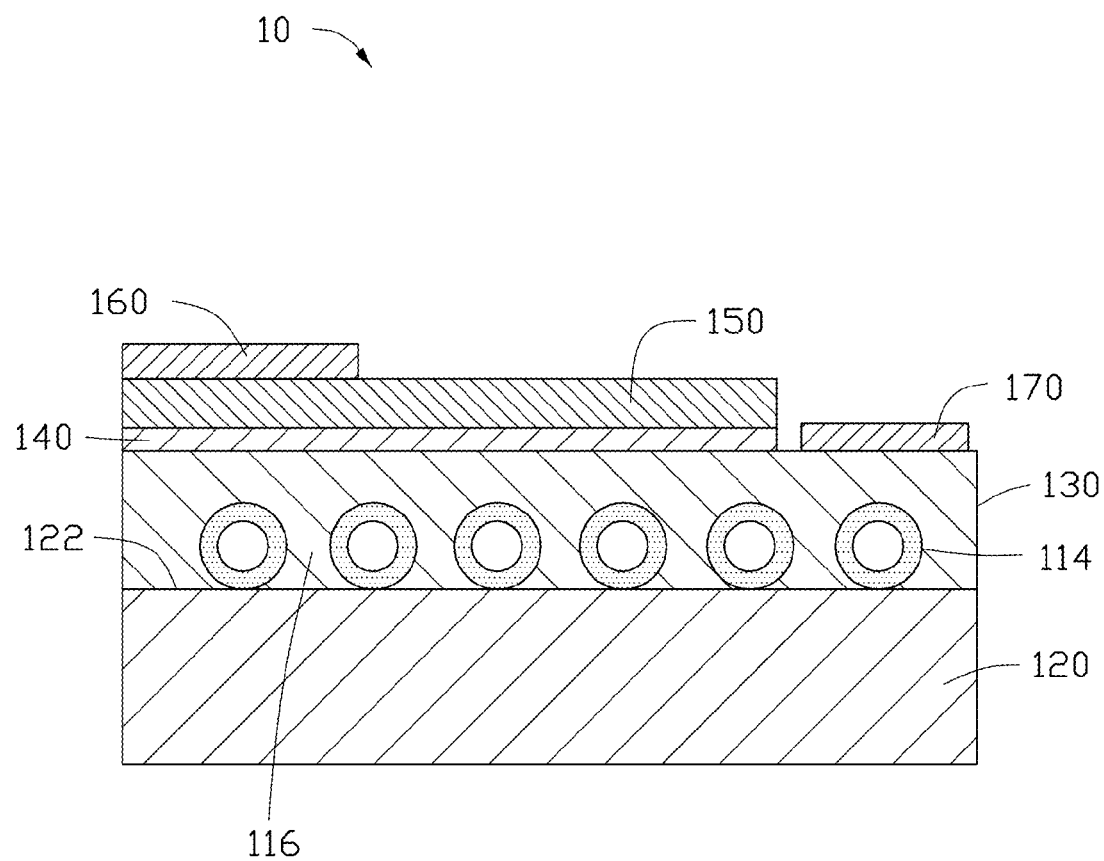
FIG. 20 is a schematic structural view of one embodiment of a light emitting diode.

Referring to FIG. 20, a light emitting diode 10 of one embodiment includes a substrate 120, a nanotube film 114, a first semiconductor layer 130, an active layer 140, and a second semiconductor layer 150, a first electrode 160, and a second electrode 170.

The substrate 120 has an epitaxial growth surface 122. The nanotube film 114 is placed on the epitaxial growth surface 122. The first semiconductor layer 130, the active layer 140, and the second semiconductor layer 150 are stacked on the same side of the epitaxial growth surface 122 in that order. The nanotube film 114 is sandwiched between the first semiconductor layer 130 and the substrate 120. The first electrode 160 is electrically connected with the second semiconductor layer 150. The second electrode 170 is electrically connected with the first semiconductor layer 130.

The nanotube film 114 is a continuous and integrated structure. The nanotube film 114 defines a plurality of apertures 116. The substrate 120 is partly exposed to the first semiconductor layer 130 from the apertures 116. The first semiconductor layer 130 penetrates the nanotube film 114 through the apertures 116 and contacts with the substrate 120. Thus, the first semiconductor layer 130 defines a plurality of caves adjacent to and oriented to the epitaxial growth surface 122.

The caves can be blind holes or grooves. The caves and the epitaxial growth surface 122 cooperatively form a sealed chamber to receive the nanotube film 114 therein. The inner wall of the caves can be spaced from the nanotubes 112 of the nanotube film 114. The surface of the first semiconductor layer 130, which is connected with the substrate 120 has a patterned depression including a plurality of parallel and spaced grooves or a plurality of intersected grooves. The nanotube film 114 is embedded in the patterned depression.

In operation of the light emitting diode 10, the first semiconductor layer 130 is an N-type semiconductor layer configured to provide electrons, and the second semiconductor layer 150 is a P-type semiconductor layer configured to provide holes. The active layer 140 is configured to provide photons. The first electrode 160 and the second electrode 170 are configured to apply a voltage. The first electrode 160 is used as the upper electrode of the light emitting diode 10, and the second electrode 170 is used as the lower electrode. When the light excited from the active layer 140 reaches the interface between the first semiconductor layer 130 and the substrate 120 at a sufficiently large incident angle, the light will be scattered. The extracting direction of the light will be changed by the grooves of the patterned depression and the nanotube film 114, thus the light can be extracted from the light emitting diode 10, and the light extraction efficiency will be improved.

Figure 21:
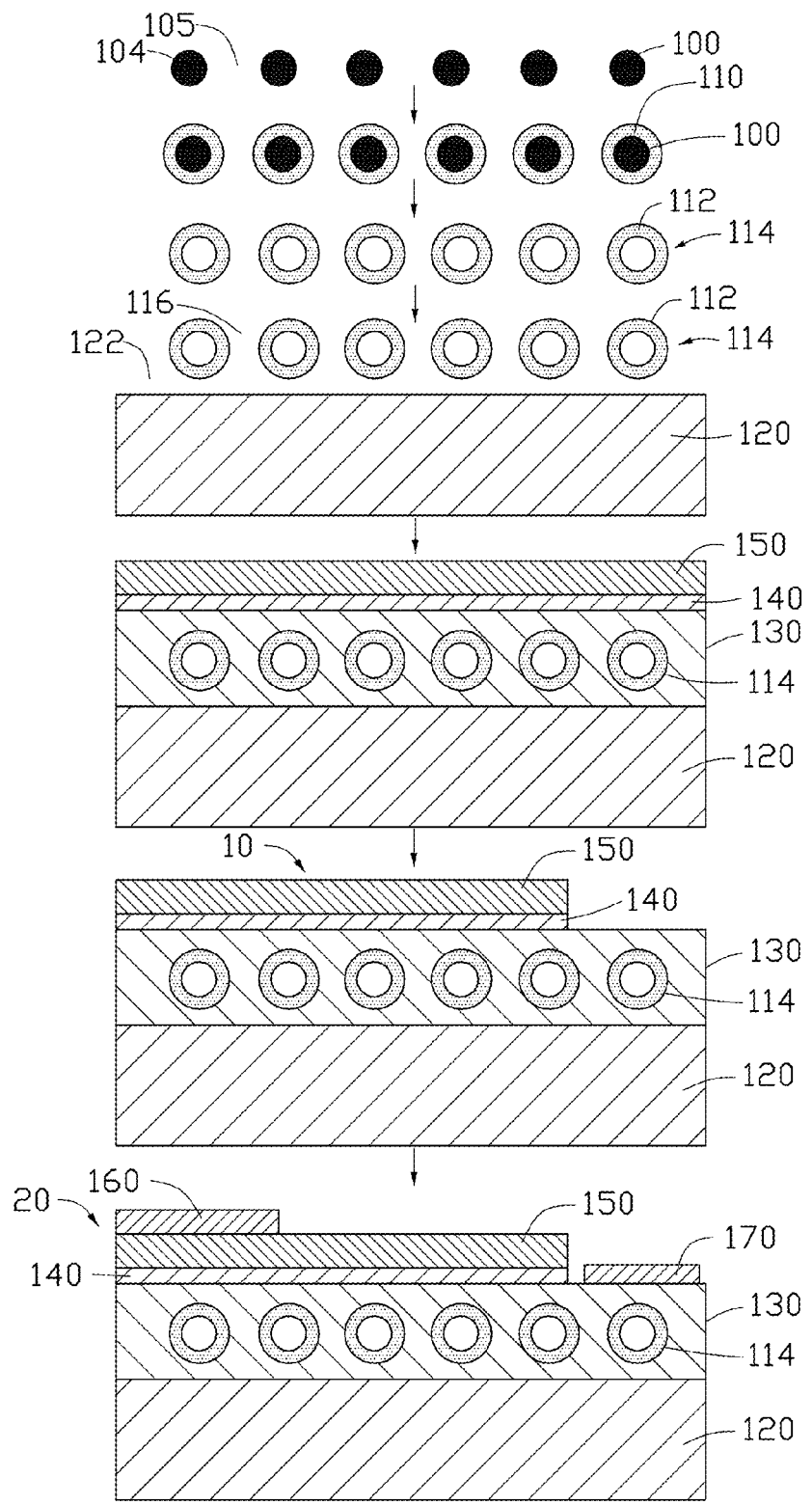
FIG. 21 is a flowchart of one embodiment of a method for making a light emitting diode.

Referring to FIG. 21, a method for making a light emitting diode 20 of one embodiment includes the following steps:

step (S10A), providing a free standing carbon nanotube film 100, wherein the carbon nanotube film 100 includes a plurality of carbon nanotubes 104 orderly arranged and combined with each other via van der Waals force to form a plurality of apertures 105 extending along a length direction of the plurality of carbon nanotubes 104;

step (S20A), inducing defects on surfaces of the plurality of carbon nanotubes 104 by suspending and treating the carbon nanotube film 100;

step (S30A), growing a nano-material layer 110 on the surfaces of the plurality of carbon nanotubes 104 by atomic layer deposition;

step (S40A), obtaining a free-standing nanotube film 114 by removing the carbon nanotube film 100 by annealing, wherein nanotube film 114 includes a plurality of nanotubes 112 orderly arranged and combined with each other;

step (S50A), suspending the nanotube film 114 above an epitaxial growth surface 122 of a substrate 120;

step (S60A), epitaxially growing a first semiconductor layer 130, an active layer 140 and a second semiconductor layer 150 on the epitaxial growth surface 122 of the substrate 120 in that order;

step (S70A), exposing a part of the first semiconductor layer 130 by etching the active layer 140 and the second semiconductor layer 150; and step (80A), applying a first electrode 160 on the second semiconductor layer 150 and a second electrode 170 on the exposed part of the first semiconductor layer 130.

The method for making the light emitting diode 20 is similar to the method for making the light emitting diode 10 described above except that in step (50A), the nanotube film 114 is suspended above and spaced from the epitaxial growth surface 122. A distance between the nanotube film 114 and the epitaxial growth surface 122 can be in a range from about 10 nanometers to about 500 micrometers. In one embodiment, the distance between the nanotube film 114 and the epitaxial growth surface 122 is in a range from about 50 nanometers to about 100 micrometers, such as about 10 micrometers.

Figure 22:
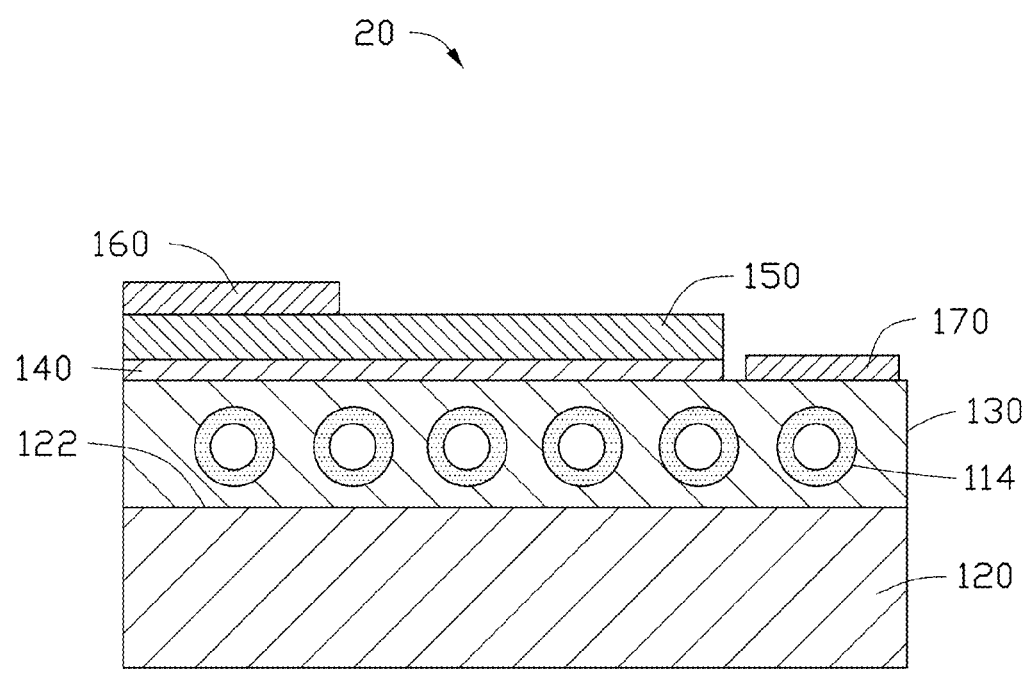
FIG. 22 is a schematic structural view of one embodiment of a light emitting diode.

Referring to FIG. 22, a light emitting diode 20 provided in one embodiment includes a substrate 120, a nanotube film 114, a first semiconductor layer 130, an active layer 140, and a second semiconductor layer 150, a first electrode 160, and a second electrode 170. The light emitting diode 20 is similar to the light emitting diode 10 described above except that the nanotube film 114 is spaced from the epitaxial growth surface 122 and fully enclosed by the first semiconductor layer 130.

Figure 23:
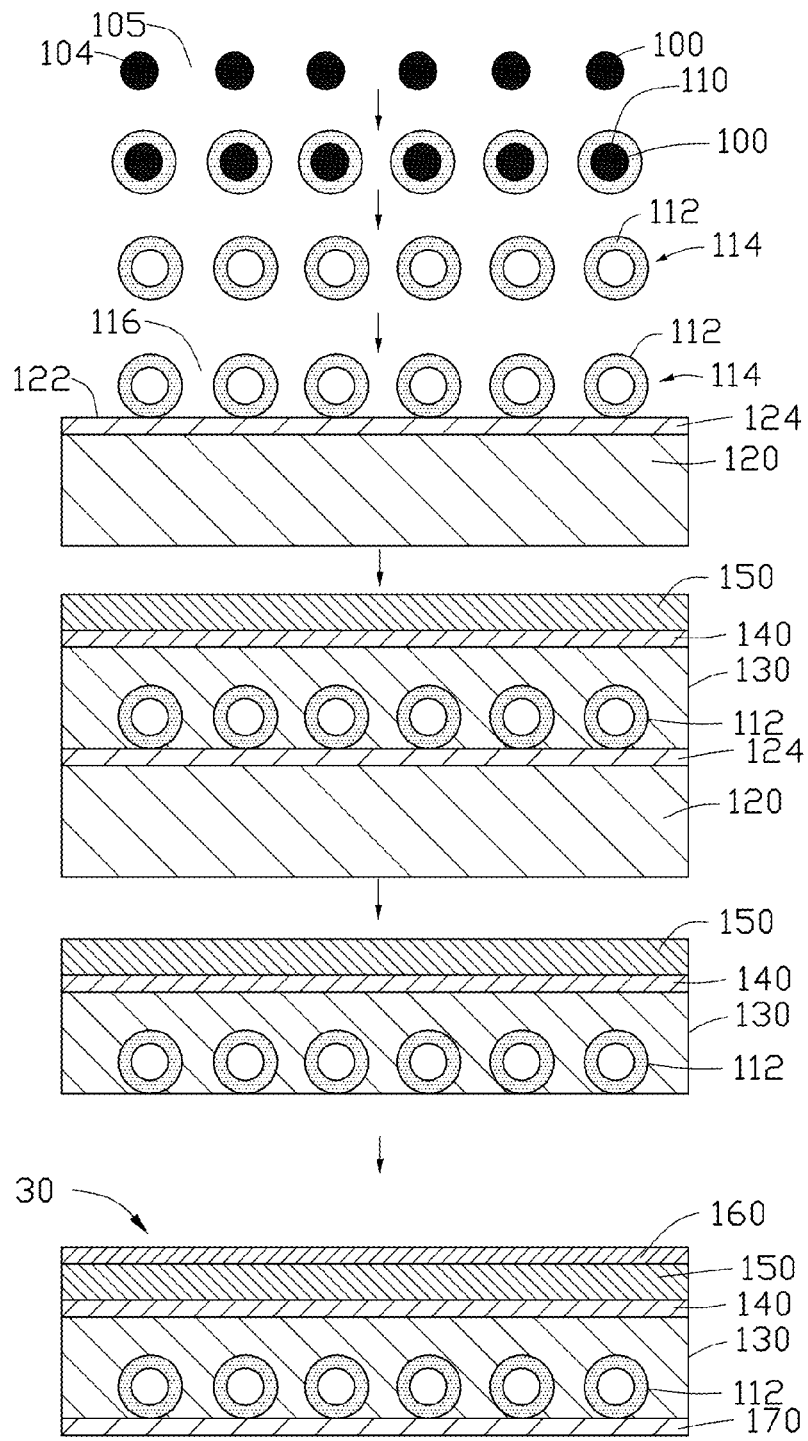
FIG. 23 is a flowchart of one embodiment of a method for making a light emitting diode.

Referring to FIG. 23, a method for making a light emitting diode 30 of one embodiment includes the following steps:

step (S10B), providing a free standing carbon nanotube film 100, wherein the carbon nanotube film 100 includes a plurality of carbon nanotubes 104 orderly arranged and combined with each other via van der Waals force to form a plurality of apertures 105 extending along a length direction of the plurality of carbon nanotubes 104;

step (S20B), inducing defects on surfaces of the plurality of carbon nanotubes 104 by suspending and treating the carbon nanotube film 100;

step (S30B), growing a nano-material layer 110 on the surfaces of the plurality of carbon nanotubes 104 by atomic layer deposition;

step (S40B), obtaining a free-standing nanotube film 114 by removing the carbon nanotube film 100 by annealing, wherein nanotube film 114 includes a plurality of nanotubes 112 orderly arranged and combined with each other;

step (S50B), growing a buffer layer 124 on an epitaxial growth surface 122 of a substrate 120 and placing the nanotube film 114 on a surface of the buffer layer 124;

step (S60B), epitaxially growing a first semiconductor layer 130, an active layer 140 and a second semiconductor layer 150 on the epitaxial growth surface 122 of the substrate 120 in that order;

step (S70B), removing the substrate 120 and the buffer layer 124; and step (80B), applying a first electrode 160 on the second semiconductor layer 150 and a second electrode 170 on the first semiconductor layer 130.

The method for making the light emitting diode 30 is similar to the method for making the light emitting diode 10 described above except that in step (50B), a buffer layer 124 is grown on the epitaxial growth surface 122 of the substrate 120 first, and the nanotube film 114 is placed on the buffer layer 124; in step (70B), the substrate 120 and the buffer layer 124 are removed; and in step (80B), the first electrode 160 covers the second semiconductor layer 150 and the second electrode 170 covers the first semiconductor layer 130.

The buffer layer 124 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD). The thickness of the buffer layer 124 can be in a range from about 10 nanometers to about 50 nanometers. The material of the buffer layer 124 can be selected according to the material of the first semiconductor layer 130 and the substrate 120 so that the lattice mismatch between the first semiconductor layer 130 and the substrate 120 can be reduced. The buffer layer 124 can be a low-temperature GaN layer, AN, TiN or SiC layer. Thus, the quality of the first semiconductor layer 130 can be improved and the substrate 120 can be removed easily.

In step (S70B), the substrate 120 and the buffer layer 124 can be removed by laser irradiation, corrosion, or thermal expansion and contraction. The method of removing the substrate 120 and the buffer layer 124 depends on the material of the buffer layer 124, the material of the substrate 120, and the material of the first semiconductor layer 130.

In one embodiment, the substrate 120 and the buffer layer 124 are removed by laser irradiation and the step (70B) includes the following substeps:

step (701B), polishing and cleaning the surface of the substrate 120;

step (702B), providing a laser beam to irradiate the substrate 120 and the first semiconductor layer 130; and step (703B), placing the substrate 120 in a solution.

In step (701B), the surface of the substrate 120 can be polished by a mechanical polishing or chemical polishing so the substrate 120 has a smooth surface to reduce the scattering in laser irradiation. The surface of the substrate 120 can be cleaned using hydrochloric acid or sulfuric acid to remove the metal impurities and/or oil dirt thereon.

In step (702B), the laser beam irradiates the polished surface of the substrate 120 substantially perpendicular to the polished surface. Thus, the laser beam can irradiate the interface between the substrate 120 and the first semiconductor layer 130. The wavelength of the laser beam can be selected according to the material of the buffer layer 124 and the substrate 120 so the energy of the laser beam is less than the band-gap energy of the substrate 120 and greater than the band-gap energy of the buffer layer 124. Thus, the laser beam can get through the substrate 120 to arrive at the buffer layer 124. The buffer layer 124 can absorb the laser beam and be heated to decompose rapidly. In one embodiment, the buffer layer 124 is a low-temperature GaN layer with a band-gap energy of 3.3 electron volts, the substrate 120 is sapphire with a band-gap energy of 9.9 electron volts, and the laser beam has a wavelength of 248 nanometers, an energy of 5 electron volts, an impulse duration from about 20 ns to about 40 ns, and an energy density from about 0.4 joules per square centimeter to about 0.6 joules per square centimeter. The shape of the laser spot is square with a side length of about 0.5 millimeters. The laser spot can move relative to the substrate 120 with a speed of about 0.5 millimeters per second. After absorption of the laser beam, the low-temperature GaN buffer layer 124 can decompose to Ga and $N_2$. The substrate 120 will not be damaged because only a small amount of the laser beam is absorbed.

In step (703B), the substrate 120 is immersed in an acid solution to remove the Ga decomposed from the GaN buffer layer 124 so the substrate 120 is separated from the first semiconductor layer 130. The acid solution can be a hydrochloric acid, sulfuric acid, or nitric acid that can dissolve the Ga. Because the buffer layer 124 is located between the nanotube film 114 and the substrate 120, the nanotube film 114 will remain on the first semiconductor layer 130 after the substrate 120 is separated from the first semiconductor layer 130. Because the buffer layer 124 is decomposed by laser irradiation and removed by immersing in acid solution, the nanotube film 114 will remain in the patterned depression. Furthermore, the $N_2$ decomposed from the GaN buffer layer 124 will expand and separate the nanotube film 114 from the substrate 120 easily. Because the nanotube film 114 allows the first semiconductor layer 130 and the buffer layer 124 to have a relative small contacting surface, the substrate 120 can be separated from the first semiconductor layer 130 easily and the damage on the first semiconductor layer 130 will be reduced.

Figure 24:
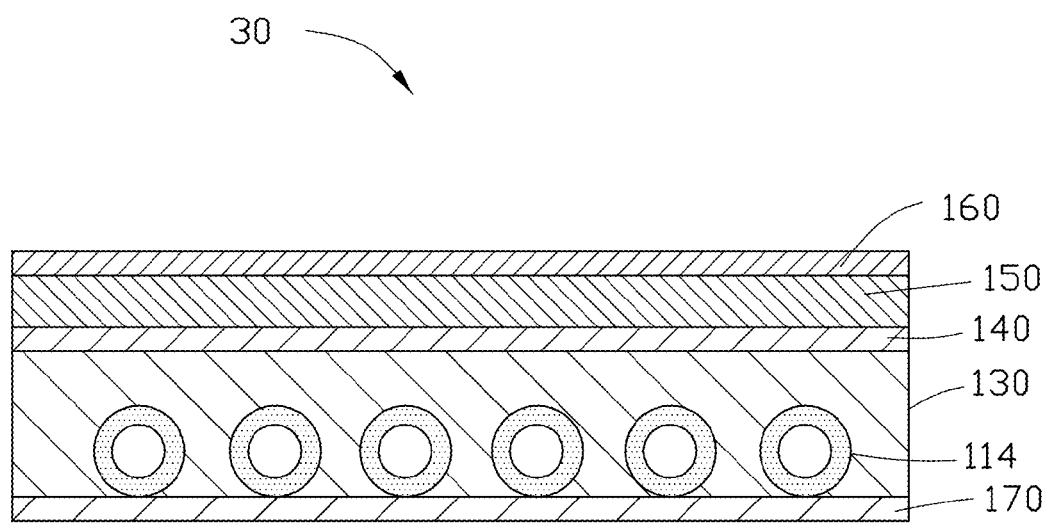
FIG. 24 is a schematic structural view of one embodiment of a light emitting diode.

Referring to FIG. 24, a light emitting diode 30 provided in one embodiment includes a nanotube film 114, a first semiconductor layer 130, an active layer 140, and a second semiconductor layer 150, a first electrode 160, and a second electrode 170. The light emitting diode 30 is similar to the light emitting diode 10 described above except the light emitting diode 30 has no substrate, the first electrode 160 covers the second semiconductor layer 150 and the second electrode 170 covers the first semiconductor layer 130.

The light emitting diode 30 is a vertical structure light emitting diode. At least one of the first electrode 160 and the second electrode 170 is transparent. In one embodiment, the second electrode 170 is a transparent conductive layer and used as a light output surface, and the first electrode 160 is a reflective conductive layer. The nanotube film 114 allows the light output surface has a patterned depression. Thus, the extracting direction of the light will be changed by the grooves of the patterned depression and the nanotube film 114, thus the light can be extracted from the light emitting diode 30, and the light extraction efficiency will be improved.

Figure 25:
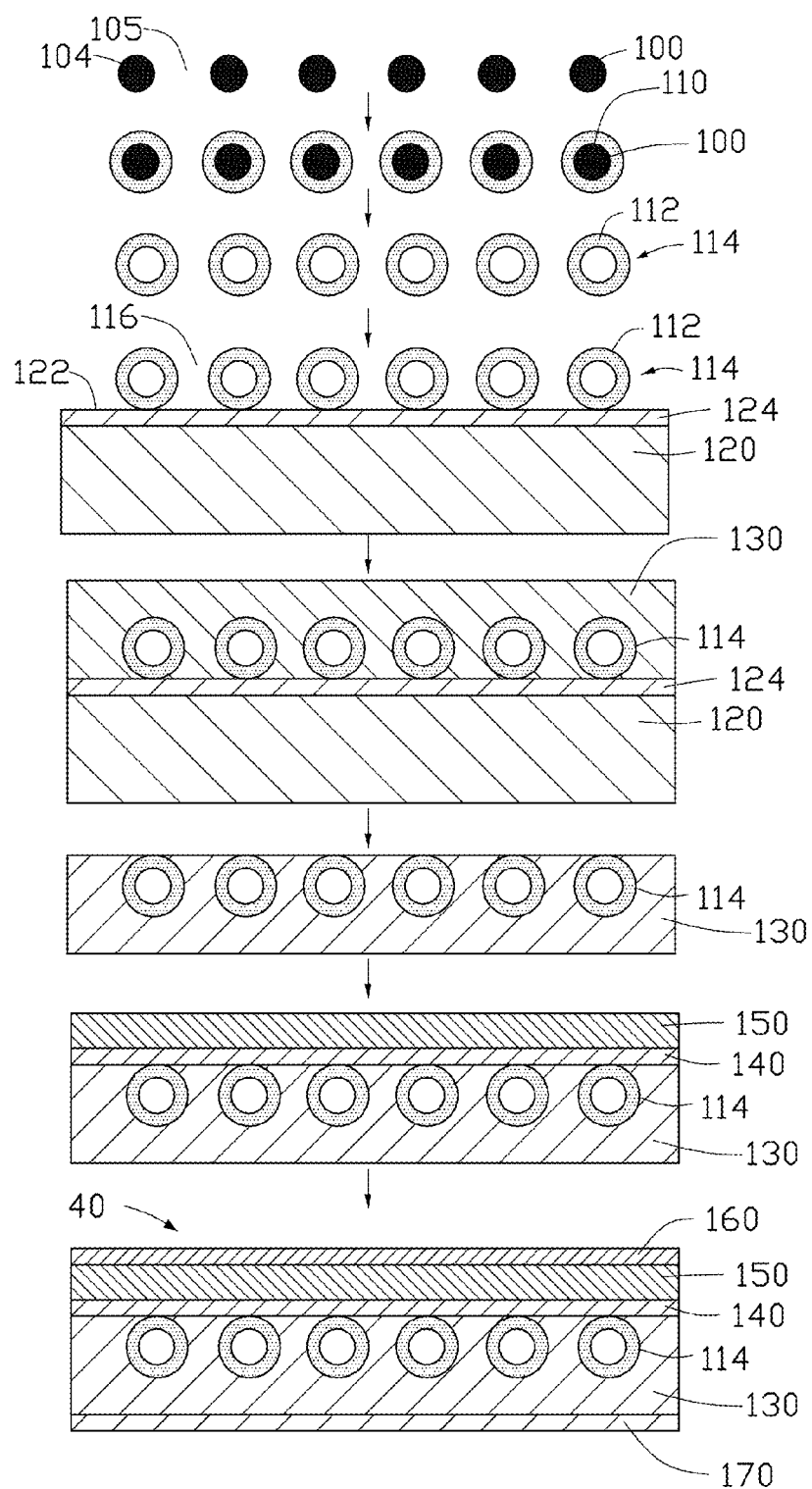
FIG. 25 is a flowchart of one embodiment of a method for making a light emitting diode.

Referring to FIG. 25, a method for making a light emitting diode 40 of one embodiment includes the following steps:

step (S10C), providing a free standing carbon nanotube film 100, wherein the carbon nanotube film 100 includes a plurality of carbon nanotubes 104 orderly arranged and combined with each other via van der Waals force to form a plurality of apertures 105 extending along a length direction of the plurality of carbon nanotubes 104;

step (S20C), inducing defects on surfaces of the plurality of carbon nanotubes 104 by suspending and treating the carbon nanotube film 100;

step (S30C), growing a nano-material layer 110 on the surfaces of the plurality of carbon nanotubes 104 by atomic layer deposition;

step (S40C), obtaining a free-standing nanotube film 114 by removing the carbon nanotube film 100 by annealing, wherein nanotube film 114 includes a plurality of nanotubes 112 orderly arranged and combined with each other;

step (S50C), growing a buffer layer 124 on an epitaxial growth surface 122 of a substrate 120 and placing the nanotube film 114 on a surface of the buffer layer 124;

step (S60C), epitaxially growing a first semiconductor layer 130 on the epitaxial growth surface 122 of the substrate 120;

step (S70C), exposing the nanotube film 114 to form an exposed surface by removing the substrate 120 and the buffer layer 124;

step (S80C), epitaxially growing an active layer 140 and a second semiconductor layer 150 on the exposed surface in that order; and step (90C), applying a first electrode 160 on the second semiconductor layer 150 and a second electrode 170 on the first semiconductor layer 130.

The method for making the light emitting diode 40 is similar to the method for making the light emitting diode 30 described above except that in step (S60C), only the first semiconductor layer 130 is grown on the growth surface 122 of the substrate 120; and in step (80C), the active layer 140 and the second semiconductor layer 150 are grown on the exposed surface formed by removing the substrate 120 and the buffer layer 124.

Figure 26:
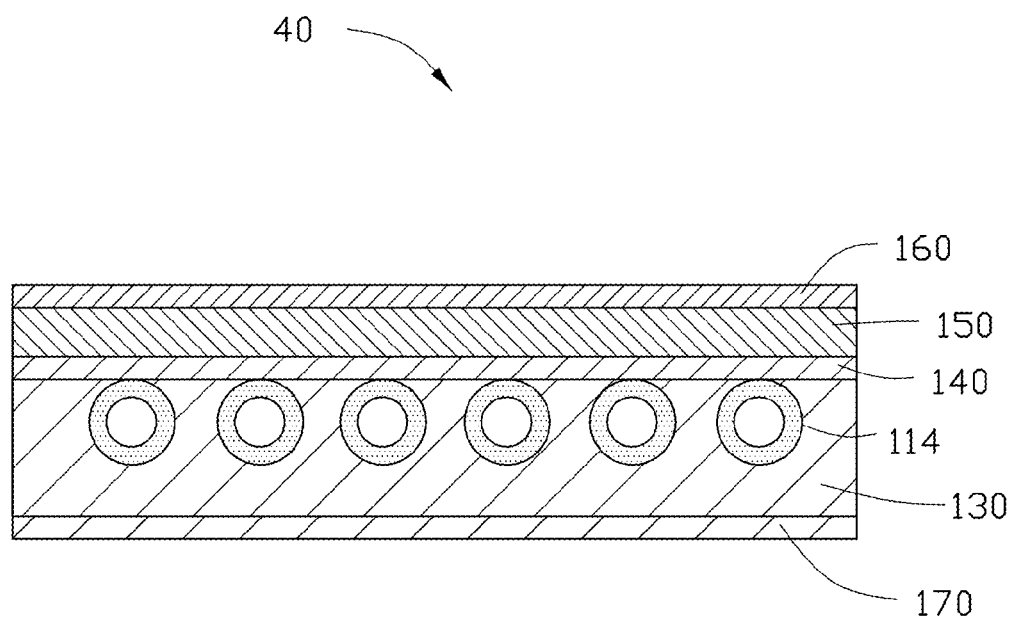
FIG. 26 is a schematic structural view of one embodiment of a light emitting diode.

Referring to FIG. 26, a light emitting diode 40 provided in one embodiment includes a nanotube film 114, a first semiconductor layer 130, an active layer 140, and a second semiconductor layer 150, a first electrode 160, and a second electrode 170. The light emitting diode 40 is similar to the light emitting diode 30 described above except that the nanotube film 114 is located between the first semiconductor layer 130 and the active layer 140. The first semiconductor layer 130 defines a patterned depression on a surface adjacent to the active layer 140.

Figure 27:
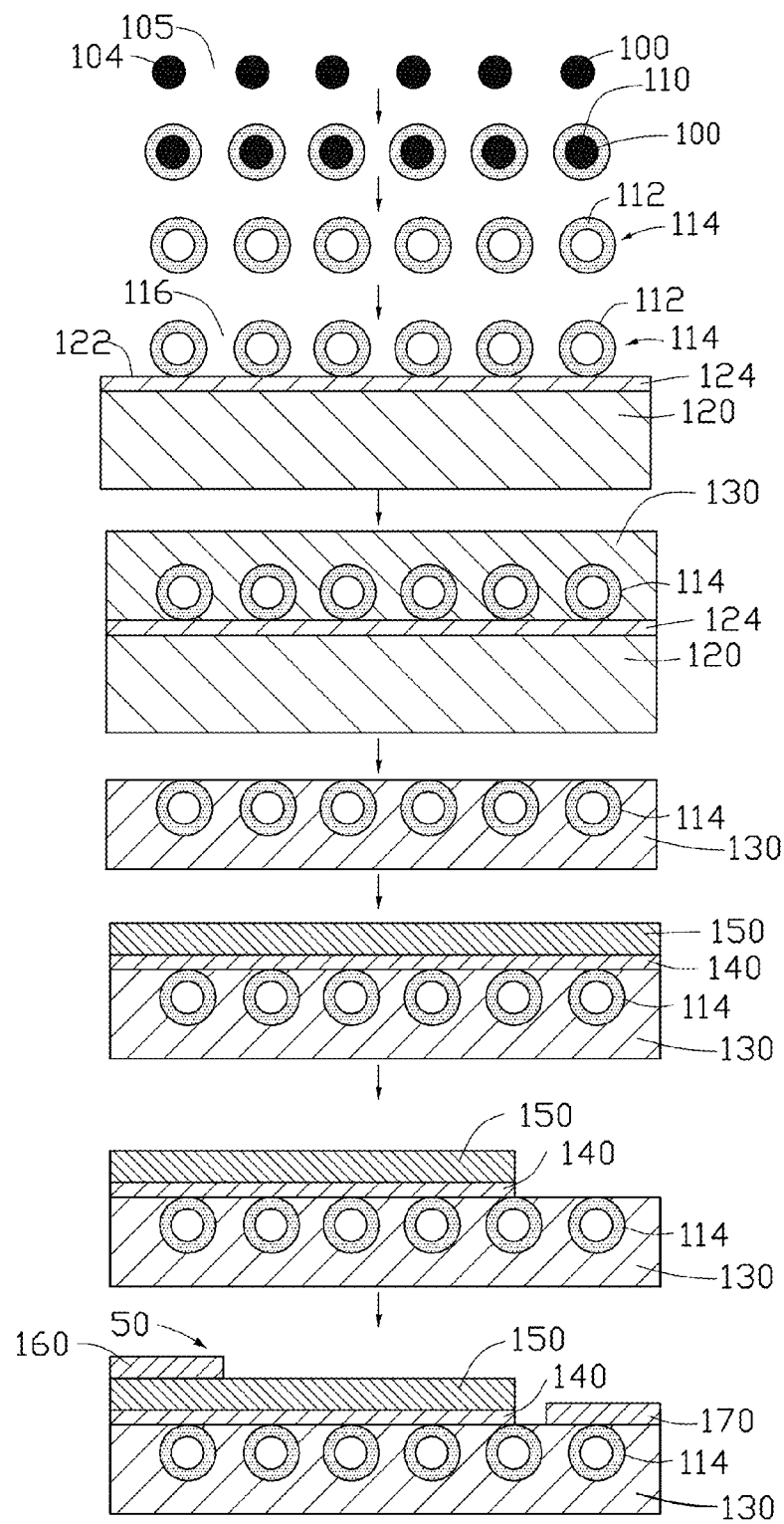
FIG. 27 is a flowchart of one embodiment of a method for making a light emitting diode.

Referring to FIG. 27, a method for making a light emitting diode 50 of one embodiment includes the following steps:

step (S10D), providing a free standing carbon nanotube film 100, wherein the carbon nanotube film 100 includes a plurality of carbon nanotubes 104 orderly arranged and combined with each other via van der Waals force to form a plurality of apertures 105 extending along a length direction of the plurality of carbon nanotubes 104;

step (S20D), inducing defects on surfaces of the plurality of carbon nanotubes 104 by suspending and treating the carbon nanotube film 100;

step (S30D), growing a nano-material layer 110 on the surfaces of the plurality of carbon nanotubes 104 by atomic layer deposition;

step (S40D), obtaining a free-standing nanotube film 114 by removing the carbon nanotube film 100 by annealing, wherein nanotube film 114 includes a plurality of nanotubes 112 orderly arranged and combined with each other;

step (S50D), growing a buffer layer 124 on an epitaxial growth surface 122 of a substrate 120 and placing the nanotube film 114 on a surface of the buffer layer 124;

step (S60D), epitaxially growing a first semiconductor layer 130 on the epitaxial growth surface 122 of the substrate 120;

step (S70D), exposing the nanotube film 114 to form an exposed surface by removing the substrate 120 and the buffer layer 124;

step (S80D), epitaxially growing an active layer 140 and a second semiconductor layer 150 on the exposed surface in that order;

step (S90D), exposing a part of the first semiconductor layer 130 by etching the active layer 140 and the second semiconductor layer 150; and step (100D), applying a first electrode 160 on the second semiconductor layer 150 and a second electrode 170 on the exposed part of the first semiconductor layer 130.

The method for making the light emitting diode 50 is similar to the method for making the light emitting diode 40 described above except that in step (S90D), part of the first semiconductor layer 130 is exposed by etching the active layer 140 and the second semiconductor layer 150.

Figure 28:
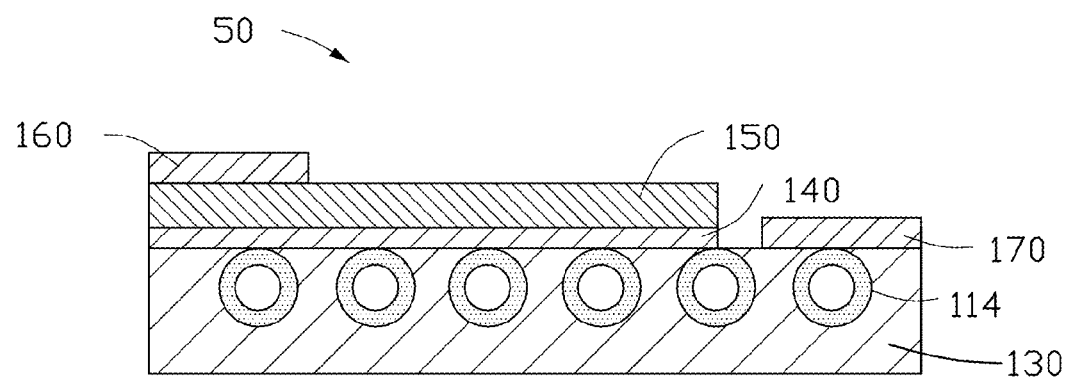
FIG. 28 is a schematic structural view of one embodiment of a light emitting diode.

Referring to FIG. 28, a light emitting diode 40 provided in one embodiment includes a nanotube film 114, a first semiconductor layer 130, an active layer 140, and a second semiconductor layer 150, a first electrode 160, and a second electrode 170. The light emitting diode 50 is similar to the light emitting diode 10 described above except that the nanotube film 114 is located between the first semiconductor layer 130 and the active layer 140. The first semiconductor layer 130 defines a patterned depression on a surface adjacent to the active layer 140.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A light emitting diode comprising:
a substrate having an epitaxial growth surface;
a first semiconductor layer, an active layer, and a second semiconductor layer stacked on the epitaxial growth surface;
a first electrode electrically connected with the second semiconductor layer;
a second electrode electrically connected with the first semiconductor layer; and
a nanotube film located between the substrate and the first semiconductor layer, wherein the nanotube film comprises a plurality of nanotubes orderly arranged and combined with each other by ionic bonds, and a material of the plurality of nanotubes is selected from the group consisting of metal oxide, metal nitride, metal carbide, silicon oxide, silicon nitride, and silicon carbide.

2. The light emitting diode of claim 1, wherein adjacent two of the plurality of nanotubes are internal communicated at a contacting surface.

3. The light emitting diode of claim 1, wherein the plurality of nanotubes are parallel to the epitaxial growth surface.

4. The light emitting diode of claim 1, wherein two stacked nanotube films are located between the substrate and the first semiconductor layer.

5. The light emitting diode of claim 4, wherein nanotubes of the two stacked nanotube films are arranged to perpendicular with each other.

6. The light emitting diode of claim 4, wherein the two stacked nanotube films are combined with each other by ionic bonds.

7. The light emitting diode of claim 1, wherein a thickness of wall of each of the plurality of nanotuhes is in a range from about 10 nanometers to about 100 nanometers.

8. The light emitting diode of claim 1, wherein at least part of the plurality of nanotuhes extend from a first side of the nanotube film to a second side opposite to the first side.

9. The light emitting diode of claim 1, wherein a length of a single one of the plurality of nanotubes is the same as a length or a width of the nanotube film.

10. The light emitting diode of claim 1, wherein the nanotube film defines a plurality of apertures to expose part of the epitaxial growth surface of the substrate.

11. The light emitting diode of claim 10, wherein part of the first semiconductor layer extend through the plurality of apertures to be in contact with the epitaxial growth surface of the substrate.

12. The light emitting diode of claim 1, wherein the first semiconductor layer defines a plurality of caves and the plurality of nanotubes are embedded in the plurality of caves.

13. The light emitting diode of claim 1, wherein the nanotube film is a free-standing structure.

* * * * *